United States Patent
Jindo et al.

(10) Patent No.: US 9,255,747 B2
(45) Date of Patent: *Feb. 9, 2016

(54) COOLING PLATE, METHOD FOR MANUFACTURING THE SAME, AND MEMBER FOR SEMICONDUCTOR MANUFACTURING APPARATUS

(71) Applicant: NGK Insulators, Ltd., Nagoya (JP)

(72) Inventors: Asumi Jindo, Okazaki (JP); Katsuhiro Inoue, Ama-Gun (JP); Yuji Katsuda, Tsushima (JP); Takashi Kataigi, Handa (JP); Shingo Amano, Chita-Gun (JP); Hiroya Sugimoto, Chiryu (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/515,736

(22) Filed: Oct. 16, 2014

(65) Prior Publication Data
US 2015/0077895 A1 Mar. 19, 2015

Related U.S. Application Data

(63) Continuation of application No. PCT/JP2014/055665, filed on Mar. 5, 2014.

(30) Foreign Application Priority Data

Mar. 15, 2013 (JP) ................. 2013-052866

(51) Int. Cl.
  *B23K 31/02* (2006.01)
  *C04B 35/653* (2006.01)
  (Continued)

(52) U.S. Cl.
  CPC ............... *F28F 3/12* (2013.01); *B23K 1/0008* (2013.01); *B23K 1/19* (2013.01); *C04B 35/565* (2013.01);
  (Continued)

(58) Field of Classification Search
  CPC ............ C04B 35/5611; C04B 35/5615; C04B 35/565; C04B 2235/3826; C04B 35/575; C04B 35/62635; B32B 9/005; B32B 38/0012; B21D 53/02

USPC ......... 264/332; 428/219, 446, 698, 699, 450, 428/615, 621, 622; 501/88, 91, 93; 165/80.4, 104.28, 185; 228/121, 174, 228/183

See application file for complete search history.

(56) References Cited

U.S. PATENT DOCUMENTS 4,729,972 A * 3/1988 Kodama et al. ................ 501/91
5,057,163 A 10/1991 Barnett et al.
(Continued)

FOREIGN PATENT DOCUMENTS

CN 101269966 A 9/2008
JP 02-077172 A1 3/1990
(Continued)

OTHER PUBLICATIONS

Qin et al., "Microstructure Characterization and Mechanical Properties of TiSi2—SiC—Ti3SiC2 Composites prepared by Spark Plasma Sintering", Materials Transactions, vol. 47, No. 3, 2006, pp. 845-848.*

(Continued)

*Primary Examiner* — Jonathan Langman
(74) *Attorney, Agent, or Firm* — Burr & Brown, PLLC

(57) ABSTRACT

A member for a semiconductor manufacturing apparatus includes an alumina electrostatic chuck, a cooling plate, and a cooling plate-chuck bonding layer. The cooling plate includes first to third substrates, a first metal bonding layer between the first and second substrates, a second metal bonding layer between the second and third substrates, and a refrigerant path. The first to third substrates are formed of a dense composite material containing Si, SiC, and Ti. The metal bonding layers are formed by thermal compression bonding of the substrates with an Al—Si—Mg or Al—Mg metal bonding material interposed between the first and second substrates and between the second and third substrates.

32 Claims, 9 Drawing Sheets

(51) Int. Cl.
  *B32B 9/06* (2006.01)
  *B32B 15/04* (2006.01)
  *B32B 15/00* (2006.01)
  *F28F 7/00* (2006.01)
  *F28D 15/00* (2006.01)
  *F28F 3/12* (2006.01)
  *C04B 35/565* (2006.01)
  *C04B 35/645* (2006.01)
  *B23K 1/00* (2006.01)
  *B23K 1/19* (2006.01)
  *C04B 35/56* (2006.01)
  *C04B 35/58* (2006.01)
  *C04B 37/00* (2006.01)
  *F28F 21/08* (2006.01)
  *H01L 21/683* (2006.01)

(52) U.S. Cl.
  CPC ......... *C04B 35/5611* (2013.01); *C04B 35/5615* (2013.01); *C04B 35/58092* (2013.01); *C04B 35/645* (2013.01); *C04B 37/006* (2013.01); *F28F 21/086* (2013.01); *H01L 21/6833* (2013.01); *C04B 2235/3839* (2013.01); *C04B 2235/3843* (2013.01); *C04B 2235/3891* (2013.01); *C04B 2235/404* (2013.01); *C04B 2235/428* (2013.01); *C04B 2235/5436* (2013.01); *C04B 2235/72* (2013.01); *C04B 2235/77* (2013.01); *C04B 2235/96* (2013.01); *C04B 2235/9607* (2013.01); *Y10T 428/249969* (2015.04)

(56) References Cited

U.S. PATENT DOCUMENTS

| | | | | |
|---|---|---|---|---|
| 5,500,394 | A | * | 3/1996 | Kondakov ........................ 501/89 |
| 5,942,455 | A | * | 8/1999 | Barsoum et al. ................. 501/91 |
| 2003/0038166 | A1 | * | 2/2003 | Gasse ........................... 228/247 |
| 2006/0169688 | A1 | | 8/2006 | Mori et al. |
| 2009/0280299 | A1 | * | 11/2009 | Ferrrato ......................... 428/157 |

FOREIGN PATENT DOCUMENTS

| | | | | |
|---|---|---|---|---|
| JP | 2006-196864 | A1 | 7/2006 | |
| JP | 2007-261830 | * | 10/2007 | ............. C04B 35/56 |
| JP | 2007-261830 | A1 | 10/2007 | |
| JP | 2008-071845 | A1 | 3/2008 | |
| JP | 2008-162875 | * | 8/2008 | ............. C04B 35/56 |
| JP | 4809092 | B2 | 11/2011 | |

OTHER PUBLICATIONS

Tang et al., "Ti3SiC2-64Volume percent SiC", Journal of Inorganic Materials, vol. 24, No. 4, 2009, pp. 821-826.*
Mogilevsky et al., "Toughening of SiC with Ti3SiC2 Particles", Journal of the American ceramic Society, vol. 89, No. 2, 2006, pp. 633-637.*
STIC Search conducted by Julia Wang, technical Searcher EIC 1700 on Jun. 18, 2015.*
International Search Report and Written Opinion (Application No. PCT/JP2014/055665) dated Jun. 3, 2014 (with English translation).
U.S. Appl. No. 14/515,800, filed Oct. 16, 2014, Jindo et al.
U.S. Appl. No. 14/190,531, filed Feb. 26, 2014, Jindo et al.
International Preliminary Report on Patentability, International Application No. PCT/JP2014/055665, dated Sep. 24, 2015 (6 pages).

* cited by examiner

COOLING PLATE, METHOD FOR MANUFACTURING THE SAME, AND MEMBER FOR SEMICONDUCTOR MANUFACTURING APPARATUS

FIELD OF THE INVENTION

The present invention relates to a cooling plate, a method for manufacturing the cooling plate, and a member for a semiconductor manufacturing apparatus.

BACKGROUND OF THE INVENTION

Electrostatic chucks are heated to high temperatures in a semiconductor process and have a cooling plate for heat dissipation. In this case, the material of the electrostatic chucks may be alumina, the material of the cooling plate may be aluminum, and a resin may be used as a bonding material. There is a very large difference in linear thermal expansion coefficient between alumina and aluminum. For example, alumina has a linear thermal expansion coefficient of 7.9 ppm/K (RT-800° C.: Uchida Rokakuho "Seramikku no butsuri (Physics of ceramics)"), and aluminum has a linear thermal expansion coefficient of 31.1 ppm/K (RT-800° C.: "Shinpen netsubussei handobukku (Thermophysical properties handbook new edition)", edited by Japan Society of Thermophysical Properties). In such electrostatic chucks, soft resins used as bonding materials can relieve stress resulting from a difference in linear thermal expansion coefficient. However, since resins are organic materials, resins have low heat dissipation ability, decompose easily at high temperatures, and tend to deteriorate over time. It is therefore difficult to use resins in a high temperature process for a long time. Thus, metal bonding was found to be effective as a heat dissipation bonding material that replaces resins. Bonding materials, such as aluminum, solder, and silver solder, are used in metal bonding. However, unlike resins, metals are stiff and cannot relieve stress resulting from a difference in linear thermal expansion coefficient between an electrostatic chuck and a cooling plate.

In metal bonding between an electrostatic chuck and a cooling plate, the characteristics required for the cooling plate include a small difference in linear thermal expansion coefficient from the electrostatic chuck, high thermal conductivity in order to maintain heat dissipation ability, high denseness that allows the passage of a coolant liquid or gas, and high strength that allows processing or installation. Patent Literature 1 discloses a composite material that can satisfy these characteristics to some extent. The composite material is a TiC-based Ti—Si—C composite material having a phase containing $Ti_3SiC_2$: 1.0% to 20.0% by volume, SiC: 0.5% to 8.0% by volume, and TiC as the remainder. Because of a small difference in linear thermal expansion coefficient between TiC and alumina, it is supposed that the Ti—Si—C composite material containing the TiC main phase described in Patent Literature 1 and alumina also have a small difference in thermal expansion coefficient.

CITATION LIST

Patent Literature

PTL 1: Japanese Patent No. 4809092

SUMMARY OF THE INVENTION

Technical Problem

Patent Literature 1 states that the TiC-based Ti—Si—C composite material can make the most of high thermal conductivity of TiC. However, the thermal conductivity of TiC is only 31.8 W/mK ("Shinpen netsubussei handobukku (Thermophysical properties handbook new edition)", edited by Japan Society of Thermophysical Properties, Yokendo Co., Ltd., March, 2008, pp. 291-294), which is below the high thermal conductivity level. Thus, it is difficult to say that the TiC-based Ti—Si—C composite material has high thermal conductivity.

The present invention solves such problems. It is a principal object of the present invention to provide a cooling plate for cooling an alumina ceramic member, the cooling plate having an internal refrigerant path and having a very small difference in linear thermal expansion coefficient from alumina and sufficiently high thermal conductivity, denseness, and strength.

Solution to Problem

A cooling plate according to the present invention is a cooling plate for cooling an alumina ceramic member. The cooling plate has an internal refrigerant path and includes a first substrate formed of a dense composite material, the dense composite material containing silicon carbide particles, titanium silicide, titanium silicon carbide, and titanium carbide, the silicon carbide particle content being in the range of 37 to 60 mass %, each of the amounts of titanium silicide, titanium silicon carbide, and titanium carbide being lower than the mass percentage of the silicon carbide particles, the percentage of open pores of the dense composite material being 1% or less, a second substrate formed of the dense composite material and having a punched portion, the punched portion having the same shape as the refrigerant path, a third substrate formed of the dense composite material, a first metal bonding layer between the first substrate and the second substrate formed by thermal compression bonding of the first substrate and the second substrate with a metal bonding material interposed therebetween, and a second metal bonding layer between the second substrate and the third substrate formed by thermal compression bonding of the second substrate and the third substrate with a metal bonding material interposed therebetween.

Alternatively, the cooling plate includes a first substrate formed of a dense composite material, the dense composite material containing silicon carbide particles, titanium silicide, titanium silicon carbide, and titanium carbide, the silicon carbide particle content being in the range of 37 to 60 mass %, each of the amounts of titanium silicide, titanium silicon carbide, and titanium carbide being lower than the mass percentage of the silicon carbide particles, the percentage of open pores of the dense composite material being 1% or less, a second substrate formed of the dense composite material and having a groove for the refrigerant path on a surface thereof facing the first substrate, and a metal bonding layer between the first substrate and the surface of the second substrate in which the groove is formed, the metal bonding layer being formed by thermal compression bonding of the first substrate and the second substrate with a metal bonding material interposed therebetween.

In the cooling plate, the substrates bonded via the metal bonding layer are formed of the dense composite material. The dense composite material has a very small difference in linear thermal expansion coefficient from alumina and has sufficiently high thermal conductivity, denseness, and strength. Thus, a member for a semiconductor manufacturing apparatus manufactured by bonding such a cooling plate to an alumina ceramic member has a long life while maintaining high heat dissipation performance without separation between the cooling plate and the alumina ceramic member even when the member is repeatedly used between low temperatures and high temperatures. Substrates formed of the dense composite material are difficult to bond together by electron-beam welding. Substrates bonded together using a resin binder have low cooling performance. In the present invention, however, substrates can be relatively easily bonded together by thermal compression bonding (hereinafter abbreviated to TCB) using a metal bonding material and have high cooling performance.

In a cooling plate according to the present invention, preferably, the metal bonding layer contains as the metal bonding material an aluminum alloy bonding material containing Mg or Si and Mg and is formed by thermal compression bonding at a temperature lower than or equal to the solidus temperature of the bonding material. This results in higher cooling performance.

In a cooling plate according to the present invention, preferably, the mass percentage of the titanium carbide in the dense composite material is lower than the mass percentage of the titanium silicide and the mass percentage of the titanium silicon carbide in the dense composite material. In the dense composite material, the mass percentage of the titanium silicide is preferably higher than the mass percentage of the titanium silicon carbide. In the dense composite material, preferably, at least one of the titanium silicide, the titanium silicon carbide, and the titanium carbide is disposed between the silicon carbide particles and covers the surface of the silicon carbide particles. In the dense composite material, the titanium carbide is preferably dispersed in the titanium silicide. The titanium silicide is preferably $TiSi_2$. The difference in average linear thermal expansion coefficient between the dense composite material and alumina is preferably 0.5 ppm/K or less at a temperature in the range of 40° C. to 570° C. The dense composite material preferably has an average linear thermal expansion coefficient in the range of 7.2 to 8.2 ppm/K at a temperature in the range of 40° C. to 570° C. The dense composite material preferably has a thermal conductivity of 75 W/mK or more. The dense composite material preferably has a four-point bending strength of 200 MPa or more. In the dense composite material, the number of silicon carbide particles 10 μm or more in length along the major axis in a SEM image (backscattered electron image) of a region 90 μm in length and 120 μm in width magnified 1000 times is preferably 16 or more.

A method for manufacturing a cooling plate according to the present invention is a method for manufacturing a cooling plate for cooling an alumina ceramic member. The cooling plate has an internal refrigerant path. The method includes (a) forming first to third substrates using a dense composite material, the dense composite material containing silicon carbide particles, titanium silicide, titanium silicon carbide, and titanium carbide, the silicon carbide particle content being in the range of 37 to 60 mass %, each of the amounts of titanium silicide, titanium silicon carbide, and titanium carbide being lower than the mass percentage of the silicon carbide particles, the percentage of open pores of the dense composite material being 1% or less, (b) forming a punched portion in the second substrate by punching the second substrate from one surface to the other surface of the second substrate such that the punched portion has the same shape as the refrigerant path, and (c) performing thermal compression bonding of the first to third substrates with a metal bonding material interposed between the first substrate and one surface of the second substrate and between the third substrate and the other surface of the second substrate.

Alternatively, the method includes (a) forming a first substrate and a second substrate using a dense composite material, the dense composite material containing silicon carbide particles, titanium silicide, titanium silicon carbide, and titanium carbide, the silicon carbide particle content being in the range of 37 to 60 mass %, each of the amounts of titanium silicide, titanium silicon carbide, and titanium carbide being lower than the mass percentage of the silicon carbide particles, the percentage of open pores of the dense composite material being 1% or less, (b) forming a groove for the refrigerant path in one surface of the second substrate, and (c) performing thermal compression bonding of the first substrate and the second substrate with a metal bonding material interposed between the first substrate and the surface of the second substrate in which the groove is formed.

The cooling plate can be easily manufactured using the method for manufacturing a cooling plate. More specifically, substrates formed of the dense composite material are difficult to bond together by electron-beam welding. Substrates bonded together using a resin binder have low cooling performance. In the present invention, however, substrates can be relatively easily bonded together by thermal compression bonding using a metal bonding material and have high cooling performance.

In the step (c) of a method for manufacturing a cooling plate according to the present invention, preferably, the metal bonding material is an aluminum alloy bonding material containing Mg or Si and Mg, and thermal compression bonding is performed at a temperature lower than or equal to the solidus temperature of the bonding material. This results in a cooling plate having higher cooling performance.

A member for a semiconductor manufacturing apparatus according to the present invention includes an alumina electrostatic chuck including an electrostatic electrode and a heater electrode, any of the cooling plates described above, and a cooling plate-chuck bonding layer formed by thermal compression bonding of the first substrate of the cooling plate and the electrostatic chuck with a metal bonding material interposed between a surface of the first substrate of the cooling plate and the electrostatic chuck.

The member for a semiconductor manufacturing apparatus has a long life while maintaining high heat dissipation performance without separation between the cooling plate and the alumina ceramic member even when the member is repeatedly used between low temperatures and high temperatures. The member for a semiconductor manufacturing apparatus can efficiently dissipate the heat from the electrostatic chuck to the cooling plate.

In a member for a semiconductor manufacturing apparatus according to the present invention, preferably, the cooling plate-chuck bonding layer contains as the metal bonding material an aluminum alloy bonding material containing Mg or Si and Mg and is formed by thermal compression bonding at a temperature lower than or equal to the solidus temperature of the bonding material.

DETAILED DESCRIPTION OF THE INVENTION

Member for Semiconductor Manufacturing Apparatus

First Embodiment

Figure 1:
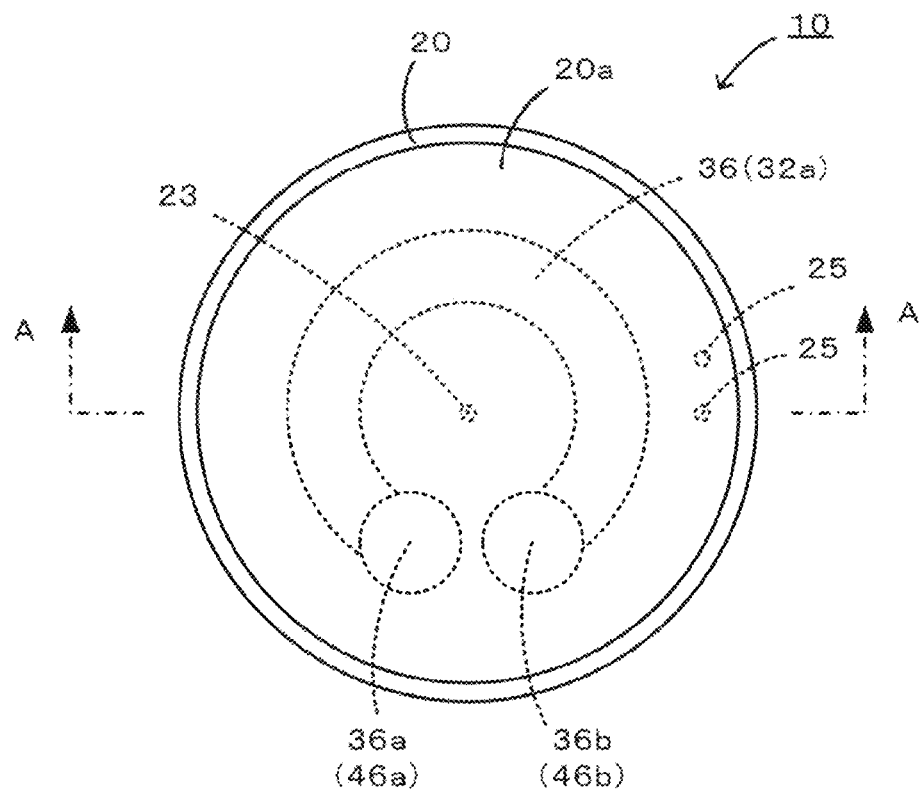
FIG. 1 is a plan view of a member 10 for a semiconductor manufacturing apparatus.
Figure 2:
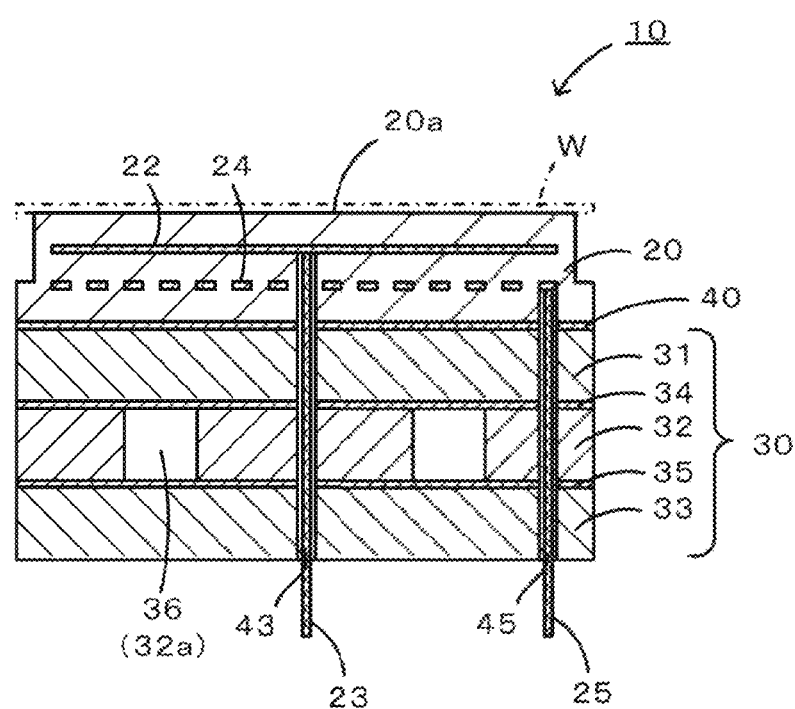
FIG. 2 is a cross-sectional view taken along the line A-A of FIG. 1.

A member 10 for a semiconductor manufacturing apparatus according to a first embodiment will be described below. FIG. 1 is a plan view of the member 10 for a semiconductor manufacturing apparatus, and FIG. 2 is a cross-sectional view taken along the line A-A of FIG. 1.

The member 10 for a semiconductor manufacturing apparatus includes an alumina electrostatic chuck 20 for adsorbing a silicon wafer W to be subjected to plasma processing, a cooling plate 30 formed of a dense composite material having substantially the same linear thermal expansion coefficient as alumina, and a cooling plate-chuck bonding layer 40 for bonding between the electrostatic chuck 20 and the cooling plate 30.

The electrostatic chuck 20 is a disc-shaped alumina plate having an outer diameter smaller than the outer diameter of the wafer W and includes an electrostatic electrode 22 and a heater electrode 24. The electrostatic electrode 22 is a planar electrode to which a direct-current voltage can be applied from an external power supply (not shown) through a rod-like power supply terminal 23. When a direct-current voltage is applied to the electrostatic electrode 22, the wafer W is adsorbed and fixed to a wafer mounting face 20a by the action of Coulomb force. When the application of the direct-current voltage is terminated, the wafer W is released from the wafer mounting face 20a. The heater electrode 24 has a pattern, for example, of a single continuous line so as to realize electric wiring over the entire surface of the electrostatic chuck 20. Upon the application of a voltage, the heater electrode 24 generates heat and heats the wafer W. A voltage can be applied to the heater electrode 24 via a rod-like power supply terminal 25 extending from the back side of the cooling plate 30 to one end and the other end of the heater electrode 24.

The cooling plate 30 is a disc-shaped plate having an outer diameter slightly greater than or equal to the outer diameter of the electrostatic chuck 20 and includes a first substrate 31, a second substrate 32, a third substrate 33, a first metal bonding layer 34 disposed between the first substrate 31 and the second substrate 32, a second metal bonding layer 35 disposed between the second substrate 32 and the third substrate 33, and a refrigerant path 36 through which a refrigerant can flow. The first to third substrates 31, 32, and 33 are formed of a dense composite material. The dense composite material contains silicon carbide particles, titanium silicide, titanium silicon carbide, and titanium carbide. The silicon carbide particle content ranges from 37 to 60 mass %. Each of the amounts of titanium silicide, titanium silicon carbide, and titanium carbide is lower than the mass percentage of the silicon carbide particles. The percentage of open pores of the dense composite material is 1% or less. The dense composite material will be described in detail later. The second substrate 32 includes a punched portion 32a. The punched portion 32a is formed by punching the second substrate 32 from one surface to the other surface of the second substrate 32 such that the punched portion 32a has the same shape as the refrigerant path 36. The first and second metal bonding layers 34 and 35 are formed by thermal compression bonding of the substrates 31 to 33 with an Al—Si—Mg or Al—Mg metal bonding material interposed between the first substrate 31 and one surface of the second substrate 32 and between the other surface of the second substrate 32 and the third substrate 33. The cooling plate 30 includes a refrigerant supply hole 46a and a refrigerant discharge hole 46b, which extend in a direction perpendicular to the wafer mounting face 20a from a surface opposite a surface to which the electrostatic chuck 20 is bonded. The refrigerant supply hole 46a and a refrigerant discharge hole 46b are connected to an inlet 36a and an outlet 36b, respectively, of the refrigerant path 36. The cooling plate 30 includes terminal insertion holes 43 and 45 passing through a surface to which the electrostatic chuck 20 is bonded and its opposite surface. The terminal insertion hole 43 is a hole into which the power supply terminal 23 of the electrostatic electrode 22 is inserted. The terminal insertion hole 45 is a hole into which the power supply terminal 25 of the heater electrode 24 is inserted.

The cooling plate-chuck bonding layer 40 is formed by thermal compression bonding of the first substrate 31 of the cooling plate 30 and the electrostatic chuck 20 with an Al—Si—Mg or Al—Mg metal bonding material interposed therebetween. The power supply terminals 23 and 25 are not in direct contact with the cooling plate 30, the first and second metal bonding layers 34 and 35, and the cooling plate-chuck bonding layer 40.

The member 10 for a semiconductor manufacturing apparatus may include a gas supply hole for supplying He gas to the back side of the wafer W and a lift pin insertion hole into which a lift pin for lifting the wafer W from the wafer mounting face 20a is inserted. The gas supply hole and the lift pin insertion hole pass through the member 10 for a semiconductor manufacturing apparatus in a direction perpendicular to the wafer mounting face 20a.

A usage example of the member 10 for a semiconductor manufacturing apparatus will be described below. First, a wafer W is placed on the wafer mounting face 20a of the member 10 for a semiconductor manufacturing apparatus in a vacuum chamber (not shown). The internal pressure of the vacuum chamber is then reduced with a vacuum pump to a predetermined degree of vacuum. A direct-current voltage is applied to the electrostatic electrode 22 to generate a Coulomb force, thereby adsorbing and fixing the wafer W to the wafer mounting face 20a. The vacuum chamber is then filled with a reactant gas at a predetermined pressure (for example, tens to hundreds of pascals), and a plasma is formed in the vacuum chamber. A surface of the wafer W is etched with the plasma. The electric power supplied to the heater electrode 24 is controlled with a controller (not shown) such that the wafer W has a target temperature.

A manufacturing example of the member 10 for a semiconductor manufacturing apparatus will be described below.

Figure 5A:
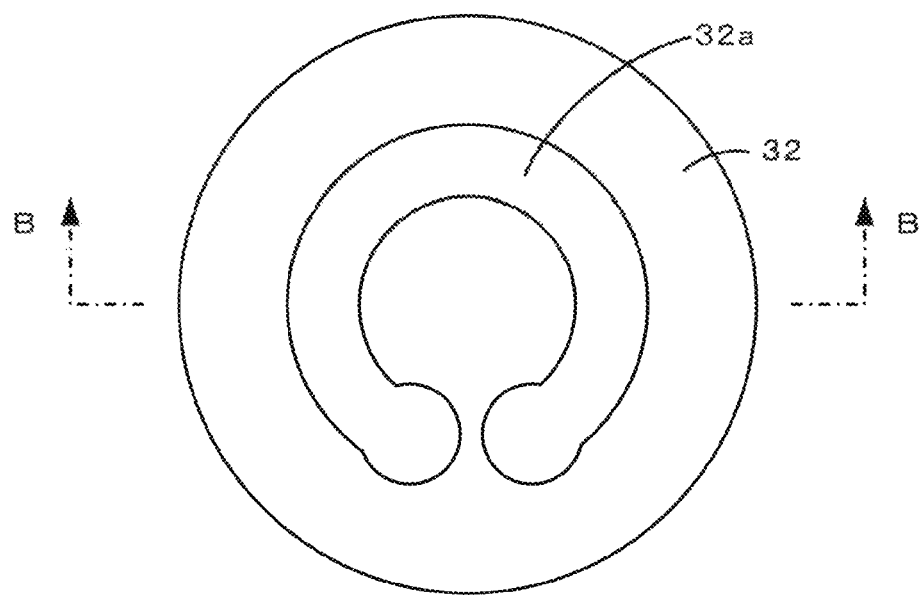
FIGS. 5A and 5B include explanatory views of a second substrate 32.
Figure 5B:
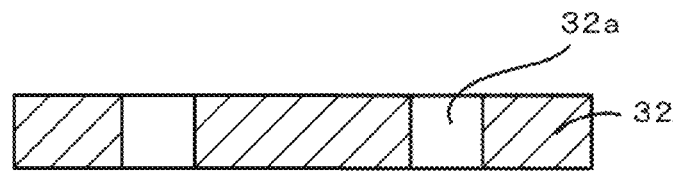

FIGS. 3A-3E and 4A-4B are manufacturing process drawings of the member 10 for a semiconductor manufacturing apparatus. FIG. 5 includes explanatory views of the second substrate 32. FIG. 5A is a plan view, and FIG. 5B is a cross-sectional view taken along the line B-B of FIG. 5A.

Figure 3A:
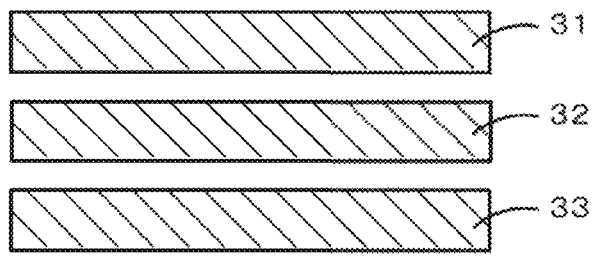
FIGS. 3A to 3E include manufacturing process drawings of the member 10 for a semiconductor manufacturing apparatus.
Figure 3B:
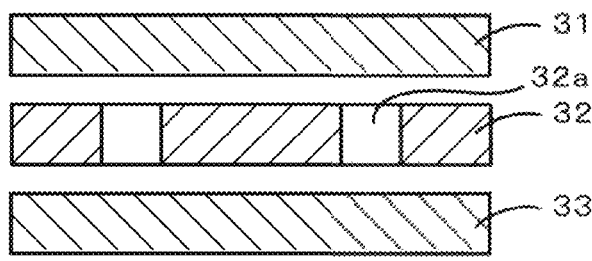
Figure 3C:
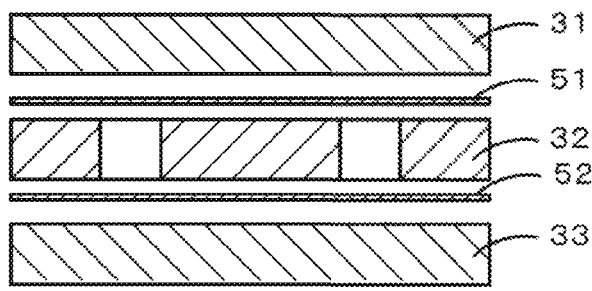
Figure 3D:
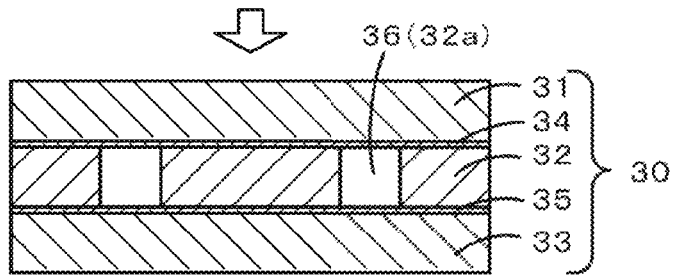
Figure 3E:
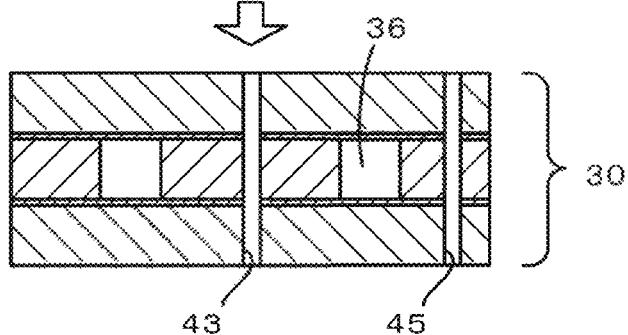
Figure 4A:
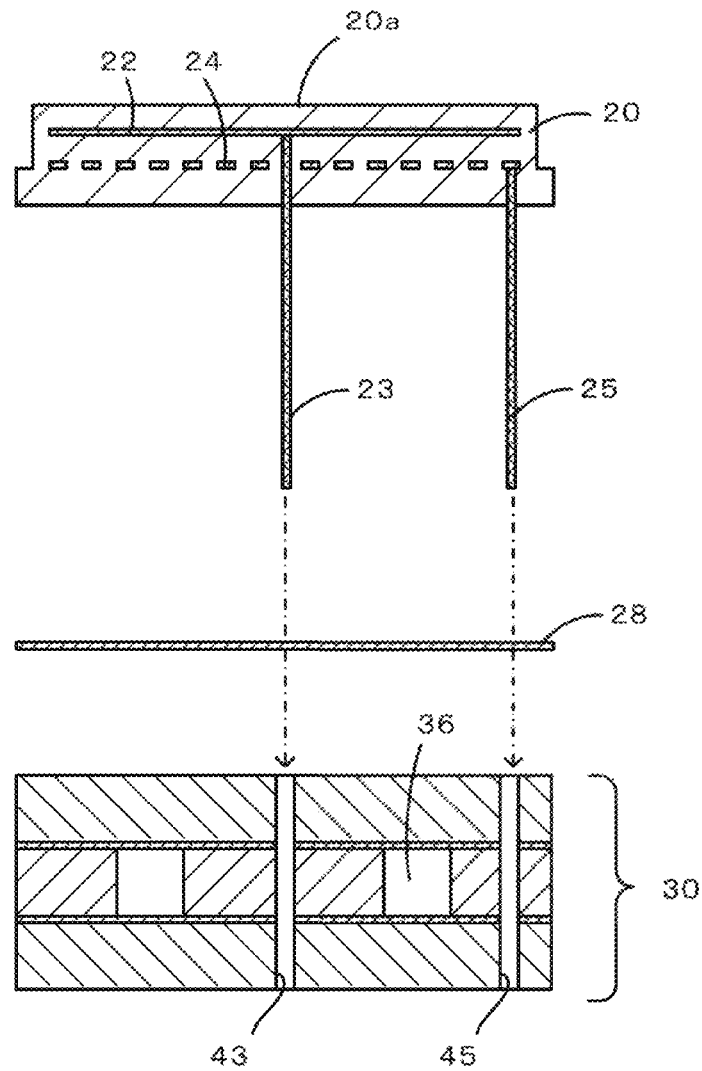
FIGS. 4A and 4B include manufacturing process drawings of the member 10 for a semiconductor manufacturing apparatus.
Figure 4B:
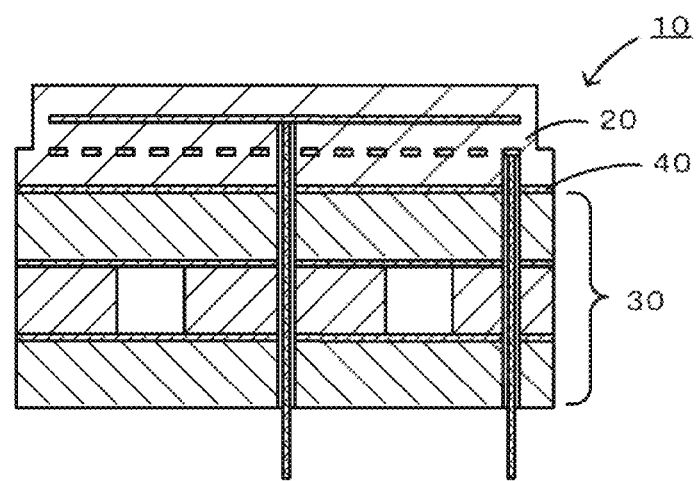

First, the first to third substrates 31 to 33 in the form of a disc-shaped thin plate are formed using the dense composite material (see FIG. 3A). The punched portion 32a is then formed in the second substrate 32 by punching the second substrate 32 from one surface to the other surface of the second substrate 32 such that the punched portion 32a has the same shape as the refrigerant path 36 (see FIG. 3B and FIGS. 5A and 5B). The punched portion 32a can be formed using a machining center, water jet, or electrical discharge machining. The first to third substrates 31 and 32 are then subjected to thermal compression bonding (see FIG. 3D) with a metal bonding material 51 interposed between the first substrate 31 and one surface of the second substrate 32 and a metal bonding material 52 interposed between the other surface of the second substrate 32 and the third substrate 33 (see FIG. 3C). In this way, the punched portion 32a becomes the refrigerant path 36, the first metal bonding layer 34 is formed between the first substrate 31 and the second substrate 32, and the second metal bonding layer 35 is formed between the second substrate 32 and the third substrate 33. Thus, the cooling plate 30 is completed. Each of the metal bonding materials 51 and 52 is preferably a Al—Si—Mg or Al—Mg bonding material. The thermal compression bonding (TCB) using these bonding materials is performed by pressing the substrates at a pressure in the range of 0.5 to 2.0 kg/mm² for 1 to 5 hours in a vacuum atmosphere at a temperature lower than or equal to the solidus temperature. The refrigerant supply hole 46a and the refrigerant discharge hole 46b are then formed. The refrigerant supply hole 46a extends from the back side of the cooling plate 30 to the inlet 36a of the refrigerant path 36. The refrigerant discharge hole 46b extends from the back side of the cooling plate 30 to the outlet 36b of the refrigerant path 36. The terminal insertion holes 43 and 45 passing through the front and back sides of the cooling plate 30 are also formed (see FIG. 3E; the inlet 36a and the outlet 36b of the refrigerant path 36, the refrigerant supply hole 46a, and the refrigerant discharge hole 46b are not shown in FIG. 3E but shown in FIG. 1).

The electrostatic chuck 20 is separately manufactured. The electrostatic chuck 20 includes the electrostatic electrode 22 and the heater electrode 24 buried therein and the power supply terminals 23 and 25 (see FIG. 4A). The electrostatic chuck 20 can be prepared as described in Japanese Unexamined Patent Application Publication No. 2006-196864. The electrostatic chuck 20 and the cooling plate 30 are subjected to thermal compression bonding with a metal bonding material 28 interposed between a surface opposite the wafer mounting face 20a of the electrostatic chuck 20 and a surface of the first substrate 31 of the cooling plate 30 while the power supply terminals 23 and 25 are inserted into the terminal insertion holes 43 and 45 (see FIG. 4A). As a result, the cooling plate-chuck bonding layer 40 is formed between the electrostatic chuck 20 and the cooling plate 30, thus completing the member 10 for a semiconductor manufacturing apparatus (see FIG. 4B). Preferably, TCB is performed using an Al—Si—Mg or Al—Mg bonding material as the metal bonding material 28, as described above.

In the cooling plate 30 according to the first embodiment described in detail, the first to third substrates 31 to 33 bonded together using the first and second metal bonding layers 34 and 35 are formed of the dense composite material. The dense composite material has a very small difference in linear thermal expansion coefficient from alumina and has sufficiently high thermal conductivity, denseness, and strength. Thus, the member 10 for a semiconductor manufacturing apparatus manufactured by bonding the cooling plate 30 to the electrostatic chuck 20, which is an alumina ceramic member, has a long life while maintaining high heat dissipation performance without separation between the cooling plate 30 and the electrostatic chuck 20 even when the member is repeatedly used between low temperatures and high temperatures. The first to third substrates 31 to 33 formed of the dense composite material are difficult to bond together by electron-beam welding. The first to third substrates 31 to 33 bonded together using a resin binder have low cooling performance. In the present invention, however, the first to third substrates 31 to 33 can be relatively easily bonded together by TCB using a metal bonding material and have high cooling performance.

The first to third substrates 31 to 33 have sufficiently high denseness and allow a coolant liquid or gas to pass through the cooling plate 30, thereby further improving cooling efficiency. Because of their sufficiently high strength, the first to third substrates 31 to 33 can withstand processing or bonding in the manufacture of the member 10 for a semiconductor manufacturing apparatus and can sufficiently withstand stress resulting from a temperature change during use.

Member for Semiconductor Manufacturing Apparatus

Second Embodiment

Figure 6:
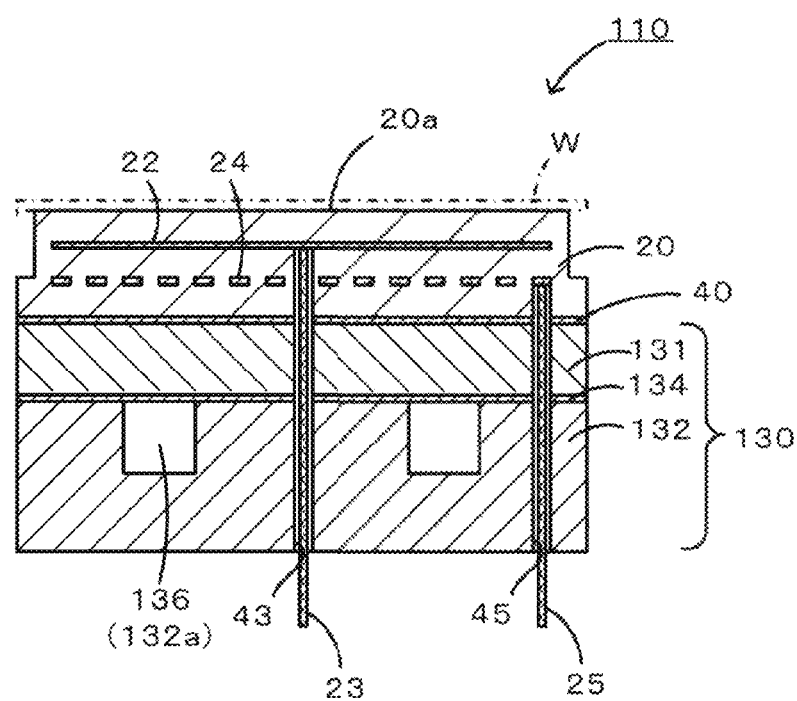
FIG. 6 is a cross-sectional view of a member 110 for a semiconductor manufacturing apparatus.
Figure 7A:
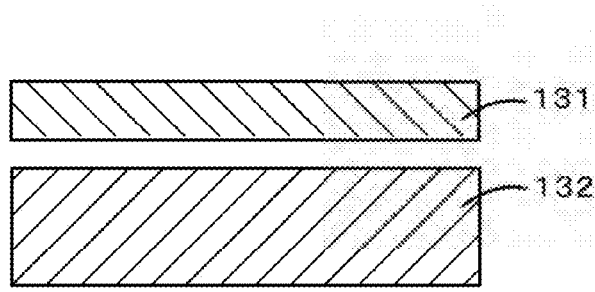
FIGS. 7A to 7E include manufacturing process drawings of the member 110 for a semiconductor manufacturing apparatus.
Figure 7B:
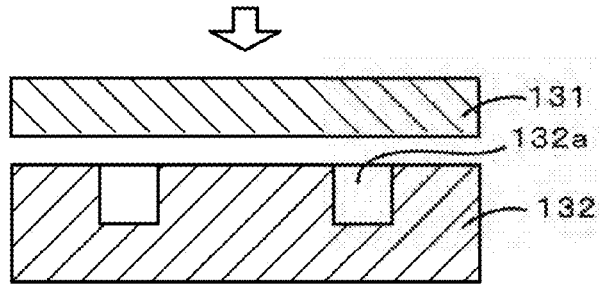
Figure 7C:
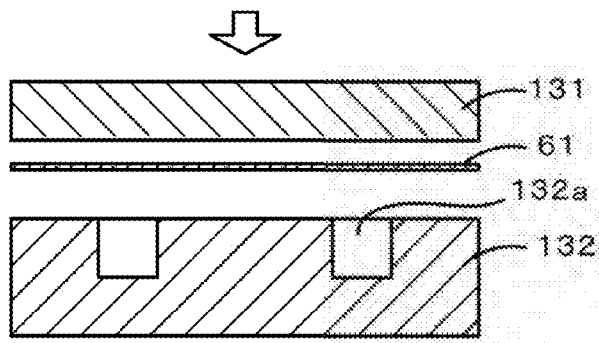
Figure 7D:
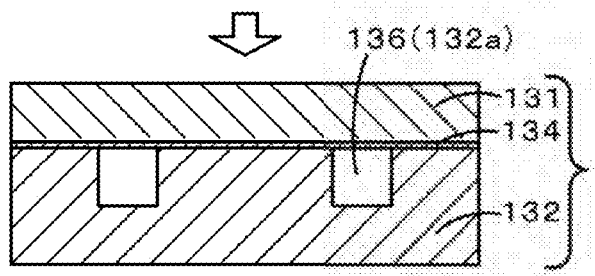
Figure 7E:
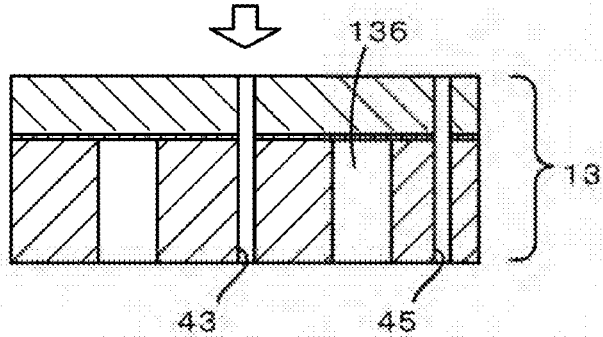

A member 110 for a semiconductor manufacturing apparatus according to a second embodiment will be described below. FIG. 6 is a cross-sectional view of the member 110 for a semiconductor manufacturing apparatus.

The member 110 for a semiconductor manufacturing apparatus includes an alumina electrostatic chuck 20 for adsorbing a silicon wafer W to be subjected to plasma processing, a cooling plate 130 formed of a dense composite material having substantially the same linear thermal expansion coefficient as alumina, and a cooling plate-chuck bonding layer 40 for bonding between the cooling plate 130 and the electrostatic chuck 20.

The electrostatic chuck 20 is the same as in the first embodiment, has the same reference numerals as in the first embodiment, and will not be further described. The cooling plate 130 is a disc-shaped plate having an outer diameter slightly greater than or equal to the outer diameter of the electrostatic chuck 20 and includes a first substrate 131, a second substrate 132, a metal bonding layer 134 disposed between the first substrate 131 and the second substrate 132, and a refrigerant path 136 through which a refrigerant can flow. The first and second substrates 131 and 132 are formed of the same material as the dense composite material used in the first embodiment. The second substrate 132 has a groove for the refrigerant path 136 in a surface thereof opposite the first substrate 131. The metal bonding layer 134 is formed by thermal compression bonding of the first substrate 131 and the second substrate 132 with an Al—Si—Mg or Al—Mg metal bonding material interposed between the first substrate 131 and a surface of the second substrate 132 in which a groove 132a is disposed. As in the first embodiment, the cooling plate 130 includes a refrigerant supply hole (not shown) and a refrigerant discharge hole (not shown) connected to an inlet and an outlet, respectively, of the refrigerant path 136. As in the first embodiment, the cooling plate 130 includes terminal insertion holes 43 and 45. The cooling plate-chuck bonding layer 40 is the same as in the first embodiment and will not be described.

A usage example of the member 110 for a semiconductor manufacturing apparatus is the same as in the first embodiment and will not be described.

Figure 8A:
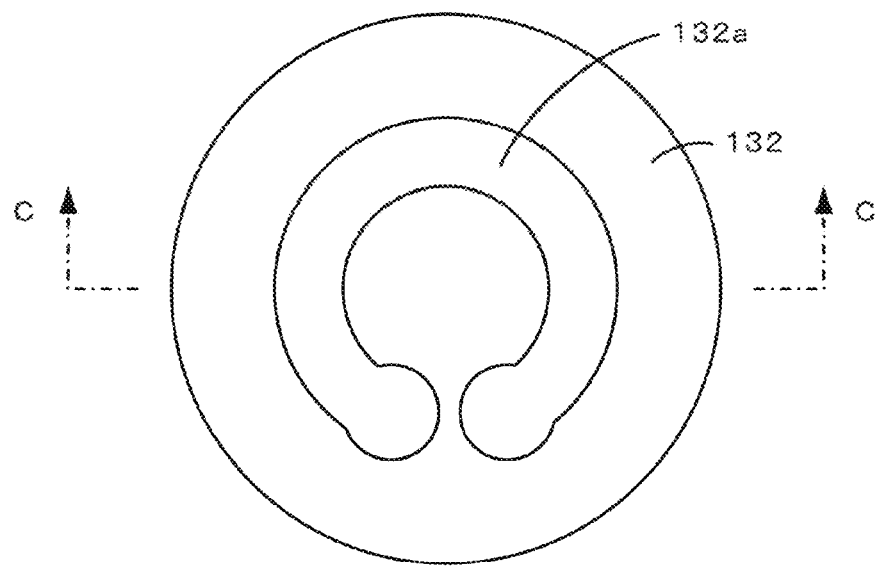
FIGS. 8A and 8B include explanatory views of a second substrate 132.
Figure 8B:
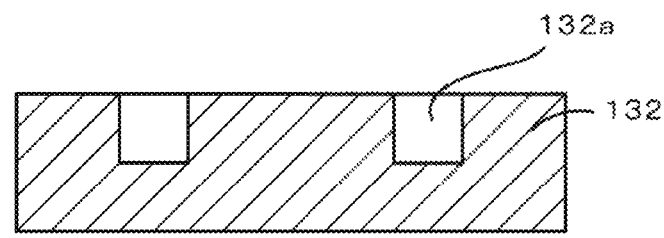

A manufacturing example of the member 110 for a semiconductor manufacturing apparatus will be described below. FIGS. 7A-7E include manufacturing process drawings of the member 110 for a semiconductor manufacturing apparatus. FIG. 8 includes explanatory views of the second substrate 132. FIG. 8A is a plan view, and FIG. 8B is a cross-sectional view taken along the line C-C of FIG. 8A. First, the first and second substrates 131 and 132 in the form of a disc-shaped thin plate are formed using the dense composite material (see FIG. 7A). The groove 132a for the refrigerant path 136 is then formed in a surface of the second substrate 132 opposite the first substrate 131 (see FIG. 7B and FIGS. 8A-8B). The groove 132a can be formed using a machining center, water jet, or electrical discharge machining. The first and second substrates 131 and 132 are then subjected to thermal compression bonding (see FIG. 7D) with a metal bonding material 61 interposed between the first substrate 131 and a surface of the second substrate 132 in which the groove 132a is formed (see FIG. 7C). In this way, the groove 132a becomes the refrigerant path 136, and the metal bonding layer 134 is formed between the first substrate 131 and the second substrate 132. Thus, the cooling plate 130 is completed. Preferably, TCB is performed using an Al—Si—Mg or Al—Mg bonding material as the metal bonding material 61, as described above. The subsequent process, that is, a process of bonding between the electrostatic chuck 20 and the cooling plate 130 is the same as in the first embodiment and will not be further described.

In the cooling plate 130 according to the second embodiment described in detail, the first and second substrates 131 and 132 bonded together using the metal bonding layer 134 are formed of the dense composite material. The dense composite material has a very small difference in linear thermal expansion coefficient from alumina and has sufficiently high thermal conductivity, denseness, and strength. Thus, the member 110 for a semiconductor manufacturing apparatus manufactured by bonding the cooling plate 130 to the electrostatic chuck 20, which is an alumina ceramic member, has a long life while maintaining high heat dissipation performance without separation between the cooling plate 130 and the electrostatic chuck 20 even when the member is repeatedly used between low temperatures and high temperatures. The first and second substrates 131 and 132 formed of the dense composite material are difficult to bond together by electron-beam welding. The first and second substrates 131 and 132 bonded together using a resin binder have low cooling performance. In the present invention, however, the first and second substrates 131 and 132 can be relatively easily bonded together by TCB using a metal bonding material and have high cooling performance.

The first and second substrates 131 and 132 have sufficiently high denseness and allow a coolant liquid or gas to pass through the cooling plate 130, thereby further improving cooling efficiency. Because of their sufficiently high strength, the first and second substrates 131 and 132 can withstand processing or bonding in the manufacture of the member 110 for a semiconductor manufacturing apparatus and can sufficiently withstand stress resulting from a temperature change during use.

[Dense Composite Material]

The dense composite material used in these embodiments contains silicon carbide particles, titanium silicide, titanium silicon carbide, and titanium carbide. The silicon carbide particle content ranges from 37 to 60 mass %. Each of the amounts of titanium silicide, titanium silicon carbide, and titanium carbide is lower than the mass percentage of the silicon carbide particles. The percentage of open pores of the dense composite material is 1% or less. The percentage of open pores is measured in accordance with Archimedes' principle using pure water as a medium.

The silicon carbide particle content ranges from 37 to 60 mass %. The content is obtained from an X-ray diffraction pattern of the composite material by simple determination using data analysis software. A silicon carbide particle content of less than 37 mass % is unfavorable because of insufficient thermal conductivity. A silicon carbide particle content of more than 60 mass % is unfavorable because of a high percentage of open pores or insufficient strength. In the dense composite material, the number of silicon carbide particles 10 m or more in length along the major axis in a SEM image (backscattered electron image) of a region 90 µm in length and 120 µm in width magnified 1000 times is preferably 16 or more. This results in sufficient sintering and densification of the composite material.

Each of the amounts of titanium silicide, titanium silicon carbide, and titanium carbide is lower than the mass percentage of the silicon carbide particles. Examples of the titanium silicide include $TiSi_2$, $TiSi$, $Ti_5Si_4$, and $Ti_5Si_3$. $TiSi_2$ is preferred. The titanium silicon carbide is preferably $Ti_3SiC_2$ (TSC). The titanium carbide is preferably TiC. The mass percentage of the titanium carbide is preferably lower than the mass percentage of the titanium silicide and the mass percentage of the titanium silicon carbide. The mass percentage of the titanium silicide is preferably higher than the mass percentage of the titanium silicon carbide. Thus, preferably, the mass percentage of the silicon carbide is the highest, and the mass percentages of the titanium silicide, the titanium silicon carbide, and the titanium carbide decrease in this order. For example, the mass percentage of the silicon carbide may range from 37 to 60 mass %, the mass percentage of the titanium silicide may range from 31 to 41 mass %, the mass percentage of the titanium silicon carbide may range from 5 to 25 mass %, and the mass percentage of the titanium carbide may range from 1 to 4 mass %.

Preferably, at least one of the titanium silicide, the titanium silicon carbide, and the titanium carbide is disposed between the silicon carbide particles and covers the surface of the silicon carbide particles. In densely dispersed silicon carbide particles, pores tend to remain between the silicon carbide particles. However, as described above, when silicon carbide particles are covered with other particles, pores can be easily filled. Thus, the dense composite material can have higher density and strength. In addition to covering the surface of silicon carbide particles, titanium carbide is preferably dispersed in a titanium silicide phase. A SEM image of FIG. 10 described below shows that titanium carbide is dispersed in large titanium silicide domains in the structure of the composite material. A large titanium silicide domain may act as a fracture origin and reduce the strength of the composite material. However, titanium carbide dispersed in titanium silicide can compensate for a decrease in the strength of the titanium silicide phase and thereby maintain the high strength of the composite material.

The dense composite material used in these embodiments has substantially the same linear thermal expansion coefficient as alumina. Thus, a member formed of a dense composite material according to the present invention bonded to a member formed of alumina (for example, by metal bonding) rarely separates even when repeatedly used between low temperatures and high temperatures. More specifically, the difference in average linear thermal expansion coefficient between a dense composite material according to the present invention and alumina is preferably 0.5 ppm/K or less at a temperature in the range of 40° C. to 570° C. More specifically, a dense composite material according to the present invention preferably has an average linear thermal expansion coefficient in the range of 7.2 to 8.2 ppm/K at a temperature in the range of 40° C. to 570° C. The average linear thermal expansion coefficient of a dense sintered alumina formed by hot-press firing of an alumina raw material having a purity of 99.99% or more was 7.7 ppm/K when measured at a temperature in the range of 40° C. to 570° C. under the same conditions as in the case of a dense composite material according to the present invention.

The dense composite material used in the embodiments has high thermal conductivity and preferably has a thermal conductivity of 75 W/mK or more. A member formed of the dense composite material bonded to a member formed of alumina by metal bonding can efficiently dissipate heat from the alumina.

The dense composite material used in the embodiments has high strength and preferably has a four-point bending strength of 200 MPa or more. A member formed of the dense composite material can be easily applied to cooling plates.

A method for producing the dense composite material used in the embodiments includes (a) preparing a powder mixture of one or more raw materials containing silicon carbide raw material particles, Ti, and Si, the silicon carbide raw material particles having an average particle size of 10 μm or more and 25 μm or less and containing 39 to 51 mass % of the powder mixture, the mass ratio Si/(Si+Ti) of Si and Ti of the raw materials other than silicon carbide being in the range of 0.26 to 0.54, and (b) sintering the powder mixture by hot pressing at a temperature in the range of 1370° C. to 1460° C. in an inert atmosphere.

When the SiC raw material has an average particle size of less than 10 μm in the step (a), this may unfavorably result in an excessively large surface area of the SiC particles and insufficient densification, and the percentage of open pores may not be 1% or less. Although the denseness of SiC particles increases with increasing average particle size of the SiC raw material and decreasing surface area of the SiC particles, an excessively large average particle size of the SiC raw material may result in insufficient strength. The particle size of SiC particles in the SEM image of FIG. 10 described below is approximately 25 μm at the maximum. Thus, it is not necessary to use raw material particles having an average particle size of more than 25 μm. When the amount of the silicon carbide raw material particles is less than 39 mass % of the powder mixture, the composite material may unfavorably have insufficient thermal conductivity. When the amount of the silicon carbide raw material particles is more than 51 mass %, the composite material may have insufficient densification, and the percentage of open pores may unfavorably be more than 1%. Examples of the one or more raw materials containing Ti and Si include a combination of metal Ti and metal Si, a combination of metal Ti, metal Si, and titanium disilicide, a combination of metal Ti and titanium disilicide, and titanium disilicide alone. When the Si/(Si+Ti) mass ratio is less than 0.26, the amount of liquid phase component derived from Ti and Si components at 1330° C. may be excessive, or a large amount of liquid phase may be rapidly formed, and it is difficult to form a dense body by hot-press firing. A low firing temperature results in insufficient densification, and a high firing temperature results in bleeding of a large amount of liquid phase component. Thus, it is difficult to produce a dense composite material having a percentage of open pores of 1% or less. A Si/(Si+Ti) mass ratio of more than 0.54 also unfavorably tends to cause the same problems because of an increased amount of liquid phase component. The Si/(Si+Ti) mass ratio more preferably ranges from 0.29 to 0.47.

Examples of the inert atmosphere in the step (b) include a vacuum atmosphere, argon gas atmosphere, helium atmosphere, and nitrogen atmosphere. The pressing pressure in hot-press firing is preferably, but not limited to, in the range of 50 to 300 kgf/cm². The hot-press firing temperature ranges from 1370° C. to 1460° C. When the firing temperature is less than 1370° C., the composite material may have insufficient densification, and the percentage of open pores may unfavorably be more than 1%. A firing temperature of more than 1460° C. unfavorably results in bleeding of a large amount of liquid phase component. Thus, it is difficult to produce a dense composite material having a percentage of open pores of 1% or less. The firing time depends on the firing conditions and may range from 1 to 10 hours.

EXAMPLES

Member for Semiconductor Manufacturing Apparatus

An electrostatic chuck 20 of a member 10 for a semiconductor manufacturing apparatus according to an example was made of alumina, was of Coulomb type, had a diameter of 297 mm, a thickness of 5 mm, and a dielectric film thickness (a thickness from an electrostatic electrode 22 to a wafer mounting face 20a) of 0.35 mm, and included a heater electrode 24 formed of a Nb coil. A cooling plate 30 was manufactured by TCB of first to third substrates 31 to 33 formed of a dense material described below in an experimental example 10 using an Al—Si—Mg bonding material (containing 88.5% by weight Al, 10% by weight Si, and 1.5% by weight Mg and having a solidus temperature of approximately 560° C.). In the TCB, the substrates were pressurized at a pressure of 1.5 kg/mm² in a vacuum atmosphere at a temperature in the range of 540° C. to 560° C. for 5 hours. The cooling plate 30 had a diameter of 340 mm and a thickness of 32 mm. The electrostatic chuck 20 and the cooling plate 30 were bonded together by TCB using the same bonding material. A cooling plate-chuck bonding layer 40 had a thickness of 0.12 mm. A member for a semiconductor manufacturing apparatus according to a comparative example was manufactured in the same manner as in the example except that the cooling plate was manufactured by bonding first to third aluminum substrates using an acrylic resin (having a thermal conductivity of 0.2 W/mK).

While pure water (a refrigerant) having a temperature of 25° C. was flown through a refrigerant path 36 in the cooling plate 30 of the member 10 for a semiconductor manufacturing apparatus according to the example at a flow rate of 13 L/min, a predetermined electric power was supplied to the heater electrode 24 to generate heat. The temperature of the wafer mounting face 20a was monitored with a surface thermometer. The member for a semiconductor manufacturing apparatus according to the comparative example was monitored in the same manner. Table 1 shows the results. Table 1 shows that the example exhibited better cooling performance than the comparative example for any electric power.

TABLE 1

| Electric power | Temperature of wafer mounting face (° C.) | |
|---|---|---|
| (W) | Comparative example | Example |
| 2000 | 30 | 7 |
| 4000 | 65 | 15 |
| 6000 | 100 | 20 |

[Dense Composite Material]

A suitable application of the dense composite material used in the embodiments will be described below. A commercial product having a purity of 97% or more and an average particle size of 15.5 or 6.9 μm was used as a SiC raw material. A SiC raw material having an average particle size of 10.1 m (experimental example 28) was prepared by mixing a SiC raw material having an average particle size of 15.5 μm and a SiC raw material having an average particle size of 6.9 μm at a ratio of 1:1. A commercial product having a purity of 97% or more and an average particle size of 9.0 μm was used as a metal Si raw material. A commercial product having a purity of 99.5% or more and an average particle size of 31.1 μm was used as a metal Ti raw material. Titanium disilicide was a commercial product having a purity of 99% or more and an average particle size of 6.9 μm.

1. Production Procedures

Preparation

The SiC raw material, the metal Si raw material, the metal Ti raw material, and the titanium disilicide raw material were weighed at the mass percentages listed in Tables 2 and 3 and were wet-blended in an isopropyl alcohol solvent in a nylon pot using iron-core nylon balls having a diameter of 10 mm for 4 hours. After blending, the resulting slurry was removed and was dried in a nitrogen stream at 110° C. The dried product was passed through a 30-mesh sieve to yield a blended powder. It was confirmed that mixing approximately 500 g of the weighed raw materials in a high-speed fluidizing mixer (the capacity of a powder charging unit was 1.8 L) while impeller blades were rotated at 1500 rpm resulted in the same material properties as the wet blending.

Molding

The blended powder was uniaxially pressed at a pressure of 200 kgf/cm$^2$ to form a disc-shaped compact having a diameter of 50 mm and a thickness of approximately 17 mm. The disc-shaped compact was placed in a graphite mold for firing.

Firing

The disc-shaped compact was subjected to hot-press firing to produce a dense sintered material. The hot-press firing was performed at a pressing pressure of 200 kgf/cm$^2$ and at a firing temperature (maximum temperature) listed in Tables 2 and 3 in a vacuum atmosphere. The vacuum atmosphere was maintained to the completion of firing. The holding time at the firing temperature was 4 hours.

2. Experimental Examples

Tables 2 and 3 show a: the starting material composition (mass ratio) of each experimental example, b: the mass ratio (Si/(Si+Ti)) of Si to the total amount of Si and Ti derived from Si, Ti, and TiSi$_2$ except SiC in the raw materials, c: the average particle size of the raw material SiC, d: the hot-press firing temperature, e: the presence or absence of bleeding of a liquid phase during a firing process, f: the number of SiC particles 10 μm or more in length along the major axis in a SEM image (backscattered electron image) of a region of a dense composite material 90 μm in length and 120 μm in width magnified 1000 times, g: the constituent phases of the composite material and their ratio determined from XRD measurement results (results of simple determination), and h: the baseline characteristics of the composite material (the percentage of open pores, bulk density, four-point bending strength, linear thermal expansion coefficient, and thermal conductivity). Among experimental examples 1 to 44, the experimental examples 2 to 5, 7, 9 to 12, 14, 16 to 19, 22 to 25, 27, 28, 31 to 34, and 43 are dense composite materials suitable for use in the embodiments, and the remainder are unsuitable materials.

TABLE 2

| No: Experimental Example ○: Suitable X: Unsuitable | a Material composition: mass ratio % | | | | b Si/(Si + Ti) *except SiC | c Particle size of SiC (μm) | d Firing temperature (° C.) | e Bleeding | f Number of SiC particles 10 μm or more | g Constituent phase | | |
|---|---|---|---|---|---|---|---|---|---|---|---|---|
| | SiC | Si | Ti | TiSi$_2$ | | | | | | SiC | TiSi$_2$ | TSC |
| No.1 (X) | 44.8 | 16.4 | 38.7 | — | 0.298 | 15.5 | 1480 | Presence | 31 | 44.1 | 31.9 | 22.2 |
| No.2 (○) | 44.8 | 16.4 | 38.7 | — | 0.298 | 15.5 | 1460 | Absence | 34 | 42.3 | 32.9 | 22.6 |
| No.3 (○) | 44.8 | 16.4 | 38.7 | — | 0.298 | 15.5 | 1430 | Absence | 31 | 42.5 | 33.1 | 22.4 |
| No.4 (○) | 44.8 | 16.4 | 38.7 | — | 0.298 | 15.5 | 1400 | Absence | 35 | 42.2 | 33.6 | 21.9 |
| No.5 (○) | 44.8 | 16.4 | 38.7 | — | 0.298 | 15.5 | 1370 | Absence | 33 | 43.1 | 32.9 | 21.9 |
| No.6 (X) | 44.8 | 16.4 | 38.7 | — | 0.298 | 15.5 | 1350 | Absence | 30 | 42.6 | 33.3 | 22.3 |
| No.7 (○) | 39.8 | 17.9 | 42.3 | — | 0.298 | 15.5 | 1430 | Absence | 22 | 37.5 | 35.7 | 24.3 |
| No.8 (X) | 44.8 | 18.9 | 36.3 | — | 0.342 | 15.5 | 1480 | Presence | 28 | 46.8 | 33.8 | 17.1 |
| No.9 (○) | 44.8 | 18.9 | 36.3 | — | 0.342 | 15.5 | 1460 | Absence | 34 | 46.3 | 34.0 | 17.2 |
| No.10 (○) | 44.8 | 18.9 | 36.3 | — | 0.342 | 15.5 | 1430 | Absence | 24 | 46.8 | 33.9 | 17.1 |
| No.11 (○) | 44.8 | 18.9 | 36.3 | — | 0.342 | 15.5 | 1400 | Absence | 30 | 46.1 | 34.6 | 17.0 |
| No.12 (○) | 44.8 | 18.9 | 36.3 | — | 0.342 | 15.5 | 1370 | Absence | 32 | 46.5 | 33.8 | 17.5 |
| No.13 (X) | 44.8 | 18.9 | 36.3 | — | 0.342 | 15.5 | 1350 | Absence | 30 | 46.4 | 33.9 | 17.2 |
| No.14 (○) | 39.8 | 20.6 | 39.6 | — | 0.342 | 15.5 | 1430 | Absence | 21 | 40.3 | 38.0 | 18.8 |
| No.15 (X) | 49.5 | 20.0 | 30.5 | — | 0.396 | 15.5 | 1480 | Presence | 33 | 54.2 | 32.1 | 11.9 |
| No.16 (○) | 49.5 | 20.0 | 30.5 | — | 0.396 | 15.5 | 1460 | Absence | 35 | 53.9 | 32.2 | 12.1 |
| No.17 (○) | 49.5 | 20.0 | 30.5 | — | 0.396 | 15.5 | 1430 | Absence | 39 | 54.5 | 32.2 | 11.4 |
| No.18 (○) | 49.5 | 20.0 | 30.5 | — | 0.396 | 15.5 | 1400 | Absence | 36 | 54.3 | 32.7 | 11.4 |
| No.19 (○) | 49.5 | 20.0 | 30.5 | — | 0.396 | 15.5 | 1370 | Absence | 31 | 53.0 | 33.9 | 10.3 |
| No.20 (X) | 49.5 | 20.0 | 30.5 | — | 0.396 | 15.5 | 1350 | Absence | 30 | 53.1 | 33.8 | 10.3 |
| No.21 (X) | 42.7 | 22.7 | 34.6 | — | 0.396 | 15.5 | 1480 | Presence | 30 | 44.9 | 38.8 | 12.8 |
| No.22 (○) | 42.7 | 22.7 | 34.6 | — | 0.396 | 15.5 | 1460 | Absence | 29 | 45.1 | 38.4 | 13.5 |

TABLE 2-continued

| | | | | | | | | | | | |
|---|---|---|---|---|---|---|---|---|---|---|---|
| No.23 (○) | 42.7 | 22.7 | 34.6 | — | 0.396 | 15.5 | 1430 | Absence | 36 | 44.5 | 38.8 | 13.6 |
| No.24 (○) | 42.7 | 22.7 | 34.6 | — | 0.396 | 15.5 | 1400 | Absence | 28 | 46.9 | 37.1 | 13.2 |
| No.25 (○) | 42.7 | 22.7 | 34.6 | — | 0.396 | 15.5 | 1370 | Absence | 31 | 45.5 | 38.1 | 13.4 |
| No.26 (X) | 42.7 | 22.7 | 34.6 | — | 0.396 | 15.5 | 1350 | Absence | 30 | 46.3 | 37.5 | 12.9 |
| No.27 (○) | 42.7 | — | 15.3 | 42.0 | 0.396 | 15.5 | 1430 | Absence | 39 | 46.4 | 38.8 | 12.1 |

| No: Experimental Example ○: Suitable X: Unsuitable | g Constituent phase | | | h Characteristics | | | | |
|---|---|---|---|---|---|---|---|---|
| | TiC | Si | Sum | Percentage of open pores (%) | Bulk density (g/cm³) | Four-point bending strength (MPa) | Linear thermal expansion coefficient (ppm/K) | Thermal conductivity (W/mK) |
| No.1 (X) | 1.8 | — | 100 | 2.6 | 3.82 | 237 | 7.5 | 70 |
| No.2 (○) | 2.1 | — | 99.9 | 0.0 | 3.83 | 328 | 7.5 | 80 |
| No.3 (○) | 2.0 | — | 100 | 0.1 | 3.83 | 320 | 7.6 | 84 |
| No.4 (○) | 2.3 | — | 100 | 0.5 | 3.83 | 301 | 7.8 | 75 |
| No.5 (○) | 2.1 | — | 100 | 0.7 | 3.83 | 296 | 7.7 | 79 |
| No.6 (X) | 1.8 | — | 100 | 4.6 | 3.80 | 220 | 7.8 | 70 |
| No.7 (○) | 2.5 | — | 100 | 0.0 | 3.91 | 309 | 8.2 | 80 |
| No.8 (X) | 2.3 | — | 100 | 2.9 | 3.78 | 250 | 7.3 | 83 |
| No.9 (○) | 2.5 | — | 100 | 0.0 | 3.82 | 328 | 7.4 | 96 |
| No.10 (○) | 2.2 | — | 100 | 0.2 | 3.80 | 316 | 7.5 | 95 |
| No.11 (○) | 2.3 | — | 100 | 0.2 | 3.80 | 310 | 7.4 | 95 |
| No.12 (○) | 2.2 | — | 100 | 0.4 | 3.78 | 304 | 7.4 | 93 |
| No.13 (X) | 2.5 | — | 100 | 3.5 | 3.77 | 230 | 7.6 | 81 |
| No.14 (○) | 2.9 | — | 100 | 0.0 | 3.86 | 309 | 7.9 | 90 |
| No.15 (X) | 1.8 | — | 100 | 2.3 | 3.68 | 255 | 7.3 | 100 |
| No.16 (○) | 1.8 | — | 100 | 0.0 | 3.70 | 315 | 7.3 | 110 |
| No.17 (○) | 1.9 | — | 100 | 0.0 | 3.69 | 303 | 7.3 | 100 |
| No.18 (○) | 1.6 | — | 100 | 0.0 | 3.69 | 320 | 7.3 | 108 |
| No.19 (○) | 2.8 | — | 100 | 0.5 | 3.61 | 277 | 7.3 | 105 |
| No.20 (X) | 2.8 | — | 100 | 2.4 | 3.68 | 238 | 7.3 | 100 |
| No.21 (X) | 3.5 | — | 100 | 0.7 | 3.76 | 265 | 7.8 | 91 |
| No.22 (○) | 3.1 | — | 100 | 0.0 | 3.79 | 315 | 7.7 | 95 |
| No.23 (○) | 3.1 | — | 100 | 0.0 | 3.79 | 313 | 7.8 | 101 |
| No.24 (○) | 2.8 | — | 100 | 0.0 | 3.79 | 310 | 7.8 | 97 |
| No.25 (○) | 3.0 | — | 100 | 0.0 | 3.79 | 313 | 7.7 | 103 |
| No.26 (X) | 3.3 | — | 100 | 2.7 | 3.68 | 240 | 7.7 | 89 |
| No.27 (○) | 2.7 | — | 100 | 0.0 | 3.78 | 308 | 7.7 | 102 |

*"—" described in constituent phases indicates that the phase is not detected.

| ○: Suitable X: Unsuitable | a Material composition: mass ratio % | | | | b Si/(Si + Ti) *except SiC | c Particle size of SiC (μm) | d Firing temperature (°C.) | e Bleeding | f Number of SiC particles 10 μm or more | g Constituent phase | | |
|---|---|---|---|---|---|---|---|---|---|---|---|---|
| | SiC | Si | Ti | TiSi₂ | | | | | | SiC | TiSi₂ | TSC |
| No.28 (○) | 42.7 | 22.7 | 34.6 | — | 0.396 | 10.1 | 1430 | Absence | 16 | 46.3 | 37.5 | 13.3 |
| No.29 (X) | 42.7 | 22.7 | 34.6 | — | 0.396 | 6.9 | 1430 | Absence | 0 | 47.3 | 37.2 | 12.8 |
| No.30 (X) | 50.7 | 23.1 | 26.2 | — | 0.468 | 15.5 | 1480 | Presence | 39 | 59.3 | 33.3 | 5.3 |
| No.31 (○) | 50.7 | 23.1 | 26.2 | — | 0.468 | 15.5 | 1460 | Absence | 36 | 59.3 | 33.3 | 5.3 |
| No.32 (○) | 50.7 | 23.1 | 26.2 | — | 0.468 | 15.5 | 1430 | Absence | 38 | 58.7 | 33.8 | 5.3 |
| No.33 (○) | 50.7 | 23.1 | 26.2 | — | 0.468 | 15.5 | 1400 | Absence | 38 | 58.0 | 34.8 | 5.1 |
| No.34 (○) | 50.7 | 23.1 | 26.2 | — | 0.468 | 15.5 | 1370 | Absence | 35 | 58.1 | 34.3 | 5.4 |
| No.35 (X) | 50.7 | 23.1 | 26.2 | — | 0.468 | 15.5 | 1350 | Absence | 36 | 58.5 | 34.4 | 5.2 |
| No.36 (X) | 51.9 | 26.3 | 21.8 | — | 0.547 | 15.5 | 1460 | Presence | 31 | 62.5 | 34.2 | 3.3 |
| No.37 (X) | 51.9 | 26.3 | 21.8 | — | 0.547 | 15.5 | 1430 | Presence | 33 | 57.8 | 37.5 | 4.7 |
| No.38 (X) | 47.4 | 30.5 | 22.1 | — | 0.580 | 15.5 | 1350 | Presence | 25 | 59.1 | 36.4 | 2.8 |
| No.39 (X) | 47.4 | 30.5 | 22.1 | — | 0.580 | 15.5 | 1320 | Absence | 28 | 60.1 | 36.1 | 1.9 |
| No.40 (X) | 42.7 | 34.8 | 22.5 | — | 0.608 | 15.5 | 1350 | Presence | 24 | 60.0 | 35.5 | 2.9 |
| No.41 (X) | 42.7 | 34.8 | 22.5 | — | 0.608 | 15.5 | 1320 | Absence | 22 | 60.5 | 34.9 | 2.1 |
| No.42 (X) | 59.5 | 16.0 | 24.5 | — | 0.396 | 15.5 | 1430 | Absence | 42 | 67.3 | 24.2 | 7.4 |
| No.17 (○) | 49.5 | 20.0 | 30.5 | — | 0.396 | 15.5 | 1430 | Absence | 39 | 54.5 | 32.2 | 11.4 |
| No.23 (○) | 42.7 | 22.7 | 34.6 | — | 0.396 | 15.5 | 1430 | Absence | 36 | 44.5 | 38.8 | 13.6 |
| No.43 (○) | 39.5 | 24.0 | 36.5 | — | 0.396 | 15.5 | 1430 | Absence | 20 | 42.8 | 40.6 | 13.7 |
| No.44 (X) | 29.5 | 27.9 | 42.6 | — | 0.396 | 15.5 | 1430 | Absence | 14 | 36.6 | 40.7 | 19.8 |

-continued

| | Constituent phase | | | Percentage of open pores (%) | Bulk density (g/cm³) | Four-point bending strength (MPa) | Linear thermal expansion coefficient (ppm/K) | Thermal conductivity (W/mK) |
|---|---|---|---|---|---|---|---|---|
| ○: Suitable  X: Unsuitable | TiC | Si | Sum | | | | | |
| No.28 (○) | 2.9 | — | 100 | 0.1 | 3.79 | 316 | 7.8 | 98 |
| No.29 (X) | 2.7 | — | 100 | 6.4 | 3.54 | 226 | 7.7 | 86 |
| No.30 (X) | 2.1 | — | 100 | 3.3 | 3.58 | 260 | 7.2 | 100 |
| No.31 (○) | 2.1 | — | 100 | 0.0 | 3.60 | 304 | 7.3 | 103 |
| No.32 (○) | 2.2 | — | 100 | 0.1 | 3.60 | 288 | 7.3 | 100 |
| No.33 (○) | 2.1 | — | 100 | 0.4 | 3.59 | 268 | 7.3 | 99 |
| No.34 (○) | 2.2 | — | 100 | 0.5 | 3.59 | 259 | 7.4 | 98 |
| No.35 (X) | 1.9 | — | 100 | 5.8 | 3.41 | 193 | 7.2 | 99 |
| No.36 (X) | — | — | 100 | 4.0 | 3.35 | 187 | 6.6 | 90 |
| No.37 (X) | — | — | 100 | 5.3 | 3.30 | 174 | 7.0 | 85 |
| No.38 (X) | — | 1.7 | 100 | 0.2 | 3.47 | 212 | 7.3 | 95 |
| No.39 (X) | — | 1.9 | 100 | 7.6 | 3.46 | 172 | 7.2 | 90 |
| No.40 (X) | — | 1.6 | 100 | 3.3 | 3.35 | 206 | 6.8 | 87 |
| No.41 (X) | — | 2.5 | 100 | 8.9 | 3.33 | 168 | 6.6 | 90 |
| No.42 (X) | 1.2 | — | 100 | 4.1 | 3.40 | 221 | 7.0 | 105 |
| No.17 (○) | 1.9 | — | 100 | 0.0 | 3.69 | 303 | 7.3 | 100 |
| No.23 (○) | 3.1 | — | 100 | 0.0 | 3.79 | 313 | 7.8 | 101 |
| No.43 (○) | 2.9 | — | 100 | 0.0 | 3.82 | 285 | 7.7 | 75 |
| No.44 (X) | 2.9 | — | 100 | 0.0 | 3.75 | 231 | 7.9 | 70 |

*"—" described in constituent phases indicates that the phase is not detected.

3. Simple Determination of Constituent Phase

A composite material was ground in a mortar, and a crystal phase in the material was identified with an X-ray diffractometer. The measurement conditions included CuKα, 40 kV, 40 mA, and 2θ=5 to 70 degrees. A sealed-tube X-ray diffractometer (D8 Advance manufactured by Bruker AXS K.K.) was used. The simple determination of the constituent phase was performed. The simple determination determined the crystal phase content of the composite material on the basis of X-ray diffraction peaks. The SiC, $TiSi_2$, TSC ($Ti_3SiC_2$), TiC, and Si contents were determined in the simple determination. A simplified profile fitting function (FPM Eval.) of powder diffraction data analysis software "EVA" available from Bruker AXS K.K. was used for the simple determination. This function calculates the quantitative ratio of constituent phases using $I/I_{cor}$ (an intensity ratio relative to the diffraction intensity of corundum) of an ICDD PDF card of an identified crystal phase. The PDF card number of each crystal phase was SiC: 00-049-1428, TiSi2: 01-071-0187, TSC: 01-070-6397, TiC: 01-070-9258 (TiC0.62), and Si: 00-027-1402.

4. Measurement of Baseline Characteristics (1) Average Particle Size

The measurement was performed with Microtrac MT3300EX manufactured by Nikkiso Co., Ltd. using pure water as a dispersion medium.

(2) Percentage of Open Pores and Bulk Density

The measurement was performed in accordance with Archimedes' principle using pure water as a medium.

(3) Four-Point Bending Strength

The measurement was performed in accordance with JIS-R1601.

(4) Linear Thermal Expansion Coefficient (Average Linear Thermal Expansion Coefficient at Temperature in Range of 40° C. to 570° C.)

A sample was heated twice to 650° C. at a heating rate of 20° C./min with TD5020S (a horizontal differential expansion measurement mode) manufactured by Bruker AXS K.K. in an argon atmosphere. The average linear thermal expansion coefficient at a temperature in the range of 40° C. to 570° C. was determined from the second measured data. An alumina standard sample attached to the apparatus (a purity of 99.7%, a bulk density of 3.9 g/cm³, and a length of 20 mm) was used as a standard sample. Another alumina standard sample was prepared. The linear thermal expansion coefficient of the other alumina standard sample measured under the same conditions was 7.7 ppm/K.

(5) Thermal Conductivity

The measurement was performed using a laser flash method.

(6) SEM Observation

A dense composite material was observed with SEM. In the SEM observation, a backscattered electron image of a cross section of a dense composite material was observed with an electron microscope (SEM; XL30 manufactured by Royal Philips Electronics). The backscattered electron image was observed at an accelerating voltage of 20 kV and at a spot size of 4.

5. Results (1) Experimental Examples 1 to 7

In the experimental examples 1 to 7, a powder mixture prepared by mixing the raw materials such that Si/(Si+Ti) was 0.298 was subjected to hot-press firing at a temperature listed in Table 2. The SiC raw material had an average particle size of 15.5 μm. In the case of a dense composite material produced at a firing temperature in the range of 1370° C. to 1460° C., the percentage of open pores was 1% or less, the four-point bending strength and thermal conductivity were sufficiently high, and the difference in linear thermal expansion coefficient from alumina was 0.5 ppm/K or less (experimental examples 2 to 5 and 7). However, when the firing temperature was 1480° C., bleeding occurred in hot-press firing, the percentage of open pores of the resulting composite material was more than 1%, and the composite material had insufficient denseness (experimental example 1). When the firing temperature was 1350° C., the percentage of open pores of the composite material was also more than 1%, and the composite material had insufficient denseness (experimental example 6). The term "bleeding" means that a liquid phase or gas phase component produced at a high temperature is sintered while the component flows out through a gap of a firing jig. Bleeding is responsible for a compositional shift or insufficient densification of the fired material and unfavorably results in corrosion and wear of the firing jig.

(2) Experimental Examples 8 to 14

In the experimental examples 8 to 14, a powder mixture prepared by mixing the raw materials such that Si/(Si+Ti) was 0.342 was subjected to hot-press firing at a temperature listed in Table 2. The SiC raw material had an average particle size of 15.5 μm. In the case of a dense composite material produced at a firing temperature in the range of 1370° C. to 1460° C., the percentage of open pores was 1% or less, the four-point bending strength and thermal conductivity were sufficiently high, and the difference in linear thermal expansion coefficient from alumina was 0.5 ppm/K or less (experimental examples 9 to 12 and 14). However, when the firing temperature was 1480° C., bleeding occurred in hot-press firing, the percentage of open pores of the resulting composite material was more than 1%, and the composite material had insufficient denseness (experimental example 8). When the firing temperature was 1350° C., the percentage of open pores of the composite material was also more than 1%, and the composite material had insufficient denseness (experimental example 13).

(3) Experimental Examples 15 to 27

In the experimental examples 15 to 27, a powder mixture prepared by mixing the raw materials such that Si/(Si+Ti) was 0.396 was subjected to hot-press firing at a temperature listed in Table 2. The SiC raw material had an average particle size of 15.5 μm. Although SiC, metal Si, and metal Ti were used as raw materials in the experimental examples 15 to 26, SiC, metal Ti, and $TiSi_2$ were used as raw materials in the experimental example 27. In the case of a dense composite material produced at a firing temperature in the range of 1370° C. to 1460° C., the percentage of open pores was 1% or less, the four-point bending strength and thermal conductivity were sufficiently high, and the difference in linear thermal expansion coefficient from alumina was 0.5 ppm/K or less (experimental examples 16 to 19, 22 to 25, and 27). However, when the firing temperature was 1480° C., bleeding occurred in hot-press firing, the percentage of open pores of the resulting composite material was more than 1%, and the composite material had insufficient denseness (experimental examples 15 and 21). When the firing temperature was 1350° C., the percentage of open pores of the composite material was also more than 1%, and the composite material had insufficient denseness (experimental examples 20 and 26). The dense composite material in the experimental example 27 in which different raw materials were used was as good as the dense composite materials in the experimental examples 22 to 25.

(4) Experimental Examples 28 and 29

In an experimental example 28, as shown in Table 3, a SiC raw material having an average particle size of 10.1 μm prepared by mixing a SiC raw material having an average particle size of 15.5 μm and a SiC raw material having an average particle size of 6.9 μm at a ratio of 1:1 was used, and a powder mixture prepared by mixing raw materials such that Si/(Si+Ti) was 0.396 was subjected to hot-press firing at 1430° C. In the resulting dense composite material, the percentage of open pores was 1% or less, the four-point bending strength and thermal conductivity were sufficiently high, and the difference in linear thermal expansion coefficient from alumina was 0.5 ppm/K or less. In an experimental example 29, as shown in Table 3, SiC having an average particle size of 6.9 μm was used, and a powder mixture prepared by mixing raw materials such that Si/(Si+Ti) was 0.396 was subjected to hot-press firing at 1430° C. The resulting composite material had a percentage of open pores of more than 1% and had insufficient denseness. Thus, it was found that the average particle size of the SiC raw material should be 10 m or more in order to produce a dense composite material.

(5) Experimental Examples 30 to 35

In the experimental examples 30 to 35, a powder mixture prepared by mixing the raw materials such that Si/(Si+Ti) was 0.468 was subjected to hot-press firing at a temperature listed in Table 3. The SiC raw material had an average particle size of 15.5 μm. In the case of a dense composite material produced at a firing temperature in the range of 1370° C. to 1460° C., the percentage of open pores was 1% or less, the four-point bending strength and thermal conductivity were sufficiently high, and the difference in linear thermal expansion coefficient from alumina was 0.5 ppm/K or less (experimental examples 31 to 34). However, when the firing temperature was 1480° C., bleeding occurred in hot-press firing, the percentage of open pores of the resulting composite material was more than 1%, and the composite material had insufficient denseness (experimental example 30). When the firing temperature was 1350° C., the percentage of open pores of the composite material was also more than 1%, and the composite material had insufficient denseness (experimental example 35).

(6) Experimental Examples 36 to 41

In experimental examples 36 to 41, as shown in Table 3, a powder mixture prepared by mixing the raw materials such that Si/(Si+Ti) was more than 0.54 was subjected to hot-press firing at different temperatures. The SiC raw material had an average particle size of 15.5 μm. Hot-press firing at a temperature of 1350° C. or more resulted in bleeding during a firing process. Except for the experimental example 38, the composite material had a percentage of open pores of more than 1% and had insufficient denseness. These composite materials contained no TiC as a constituent phase, and some of the composite materials contained Si instead of TiC. The four-point bending strength was generally low. Although the experimental example 37 and the experimental example 35 had high porosity, the experimental example 35, which contained TiC as a constituent phase, had higher bending strength than the experimental example 37. This is probably because TiC dispersed in titanium silicide increased strength.

(8) Experimental Examples 42 to 44, 17, and 23

In experimental examples 42 to 44 and experimental examples 17 and 23, as shown in Table 3, a powder mixture prepared by mixing the raw materials such that Si/(Si+Ti) was 0.396 was subjected to hot-press firing at 1430° C. The mass percentages of the raw materials SiC, metal Si, and metal Ti were different. As a result, when the amount of the SiC raw material was more than 59 mass %, the amount of SiC particles in the composite material was more than 60 mass %, and the composite material had sufficiently high four-point bending strength and thermal conductivity, but had a percentage of open pores of more than 1% and had insufficient denseness, and the difference in linear thermal expansion coefficient from alumina was more than 0.5 ppm/K (experimental example 42). When the amount of the SiC raw material was less than 30 mass %, the amount of SiC particles in the composite material was less than 37 mass %, and the thermal conductivity was insufficient (experimental example 44). In contrast, when the mass percentage of the SiC raw material was in an appropriate range, the percentage of open pores was 1% or less, the four-point bending strength and thermal conductivity were sufficiently high, and the difference in linear thermal expansion coefficient from alumina was 0.5 ppm/K or less. Thus, a dense composite material was produced (experimental examples 43, 17, and 23).

(9) Summary

The difference in linear thermal expansion coefficient between alumina and the dense composite materials produced in the experimental examples 2 to 5, 7, 9 to 12, 14, 16 to 19, 22 to 25, 27, 28, 31 to 34, and 43 was 0.5 ppm/K or less. The dense composite materials had sufficiently high thermal conductivity, denseness, and strength. Thus, a member for a semiconductor manufacturing apparatus that is formed by metal bonding of a first member formed of such a dense composite material and a second member formed of alumina has a long life without separation between the first member and the second member even when the member is repeatedly used between low temperatures and high temperatures. In these experimental examples, the amount of SiC in the raw material composition of the dense composite material ranges from 39 to 51 mass %, and the amount of SiC particles in the dense composite material ranges from 37 to 60 mass %.

6. Discussion (1) Average Particle Size of SiC Raw Material

It was found that the SiC raw material preferably has an average particle size of 10 μm or more and 25 μm or less in order to produce a dense composite material. When the SiC raw material has an average particle size of less than 10 μm, the percentage of small SiC particles and the surface area of the SiC particles are excessively increased. This results in insufficient densification, and the percentage of open pores may be more than 1% (experimental example 29). SiC is an aggregate, and the surface of SiC reacts with another component. Thus, SiC particles after firing have a slightly smaller average particle size than the SiC raw material. Although the denseness of SiC particles increases with increasing average particle size of the SiC raw material and decreasing surface area of the SiC particles, an excessively large average particle size of the SiC raw material may result in insufficient strength. The particle size of SiC particles in the SEM image of FIG. 10 described below is approximately 25 μm at the maximum. Thus, it is not necessary to use raw material particles having an average particle size of more than 25 μm.

(2) Constituent Phase

In order to produce a dense composite material, it is essential that 37 to 60 mass % SiC particles are contained as a constituent phase, and each of the mass percentages of $TiSi_2$, TSC, and TiC is smaller than the mass percentage of SiC. When the amount of the SiC particles is more than 60 mass %, the percentage of open pores is more than 1%, the material has insufficient denseness, and the difference in linear thermal expansion coefficient between the composite material and alumina is 0.5 ppm/K or more (experimental example 42). When the amount of the SiC particles is less than 37 mass %, this results in insufficient thermal conductivity (experimental example 44).

(3) Si/(Si+Ti)

Figure 9:
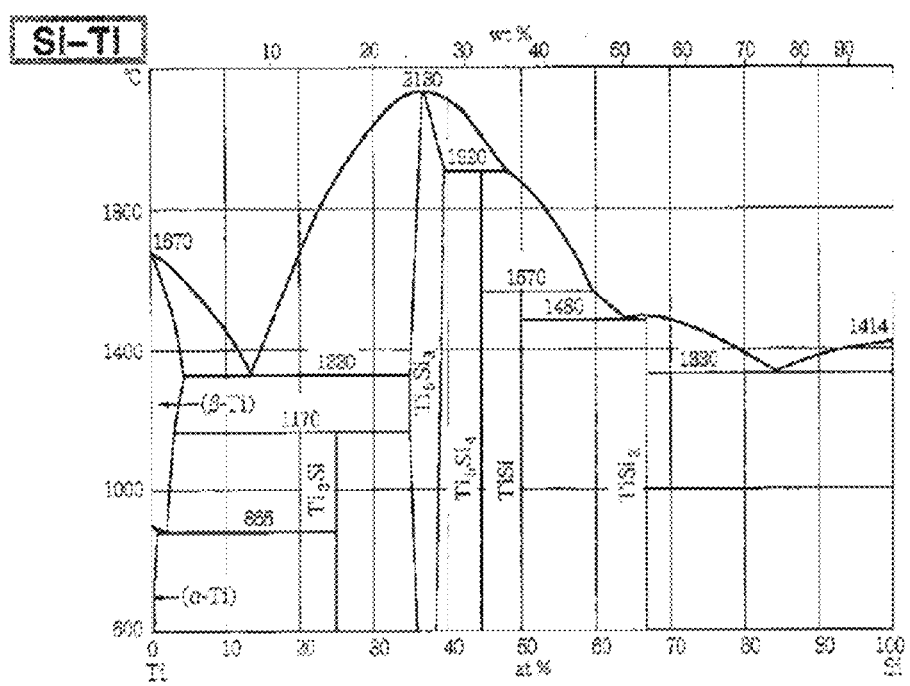
FIG. 9 is a Si—Ti two-component phase diagram.

With respect to the mass ratio b or Si/(Si+Ti) in Tables 2 and 3, FIG. 9 shows a Si—Ti two-component phase diagram. The horizontal axis on the upper side of the phase diagram represents Si/(Si+Ti). Si/(Si+Ti) is preferably in the appropriate range of 0.26 to 0.54 (26% to 54% by weight on the horizontal axis on the upper side in FIG. 9). In this appropriate range, titanium silicides represented by the chemical formulae $TiSi_2$, TiSi, $Ti_5Si_4$, and $Ti_5Si_3$ are formed at a certain ratio in firing. Thus, these titanium silicides and the surface of the SiC particles react and produce titanium disilicide, titanium silicon carbide, and titanium carbide ($TiC_x$).

When Si/(Si+Ti) is outside the appropriate range, that is, more than 0.54 or less than 0.26, as is clear from the two-component phase diagram, the amount of liquid phase component derived from Ti and Si components at 1330° C. may be excessive, or a large amount of liquid phase may be rapidly formed, and it is difficult to form a dense body by hot-press firing. A low firing temperature results in insufficient densification, and a high firing temperature results in bleeding of a large amount of liquid phase component. Thus, it is difficult to produce a dense composite material having a percentage of open pores of 1% or less. Furthermore, in this region, a temperature width required for sintering in mass production (for example, 30° C. or more) cannot be obtained. More specifically, when Si/(Si+Ti) is above the upper limit of the appropriate range as in the experimental examples 36 to 41, TiC was not formed in firing, and bleeding was often observed. Furthermore, in the resulting composite materials, the percentage of open pores was often more than 1%, and the four-point bending strength was often less than 200 MPa. For Si/(Si+Ti) in the appropriate range, no bleeding occurred in hot-press firing at a firing temperature in the range of 1370° C. to 1460° C.

(4) Firing Temperature

When the firing temperature was more than 1460° C., even in the case of appropriate raw material compositions, the percentage of open pores was more than 1%, and densification was not achieved (experimental examples 1, 8, 15, 21, and 30). This is probably because bleeding occurred in hot-press firing. When the firing temperature was less than 1370° C., even in the case of appropriate raw material compositions, the percentage of open pores was also more than 1%, and densification was not achieved (experimental examples 6, 13, 20, 26, and 35). It was therefore found that the suitable firing temperature ranged from 1370° C. to 1460° C.

(5) SEM Image (Backscattered Electron Image)

Figure 10:
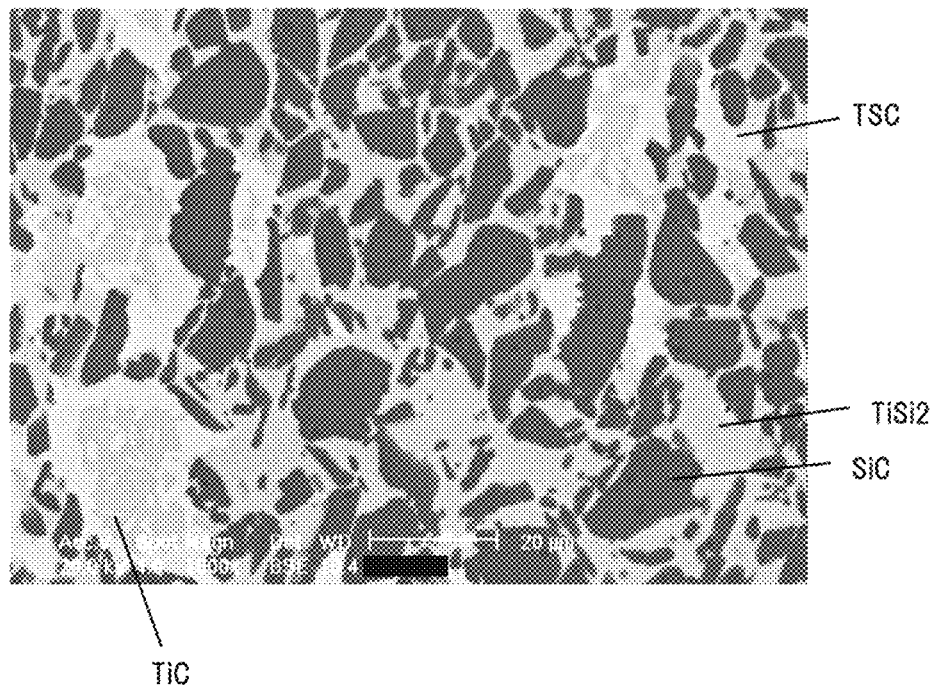
FIG. 10 is a SEM image (backscattered electron image) of a dense composite material prepared in an experimental example 2.

FIG. 10 is a photograph of a backscattered electron image in the experimental example 2. This photograph is a SEM image (backscattered electron image) of a region 90 μm in length and 120 μm in width magnified 1000 times taken after polishing of a cross section of a dense composite material. In FIG. 10, dark gray particles are SiC particles, gray structures between the SiC particles are $TiSi_2$, light gray structures between the SiC particles are TSC, and columnar structures dispersed in $TiSi_2$ are TiC (substantially the same brightness as TSC). FIG. 10 shows that at least one of TSC, $TiSi_2$, and TiC covers the surface of the SiC particles. For each SiC particle entirely present in the visual field in FIG. 10, the length of the SiC particle along the major axis (the maximum diameter of the particle) was determined. The number of SiC particles 10 μm or more in length along the major axis was 34. Also in other experimental examples, the number of SiC particles 10 μm or more in length along the major axis was determined from backscattered electron images of dense composite materials suitable for use in the embodiments described above. The number of SiC particles 10 μm or more in length along the major axis was 16 or more as shown in Tables 2 and 3.

The present application claims priority from Japanese Patent Application No. 2013-052866 filed on Mar. 15, 2013, the entire contents of which are incorporated herein by reference.

INDUSTRIAL APPLICABILITY

A cooling plate according to the present invention can be used as a cooling plate bonded to an alumina electrostatic chuck or susceptor by metal bonding.

The invention claimed is:

1. A cooling plate having an internal refrigerant path and used for cooling an alumina ceramic member, including:
   a first substrate formed of a dense composite material, the dense composite material containing silicon carbide particles, titanium silicide, titanium silicon carbide, and titanium carbide, the silicon carbide particle content being in the range of 37 to 60 mass %, each of the amounts of titanium silicide, titanium silicon carbide, and titanium carbide being lower than the mass percentage of the silicon carbide particles, the percentage of open pores of the dense composite material being 1% or less,
   a second substrate formed of the dense composite material and having a punched portion, the punched portion having the same shape as the refrigerant path,
   a third substrate formed of the dense composite material,
   a first metal bonding layer between the first substrate and the second substrate formed by thermal compression bonding of the first substrate and the second substrate with a metal bonding material interposed therebetween, and
   a second metal bonding layer between the second substrate and the third substrate formed by thermal compression bonding of the second substrate and the third substrate with a metal bonding material interposed therebetween.

2. The cooling plate according to claim 1, wherein the metal bonding layer contains as the metal bonding material an aluminum alloy bonding material containing Mg or Si and Mg and is formed by thermal compression bonding at a temperature lower than or equal to the solidus temperature of the bonding material.

3. The cooling plate according to claim 1, wherein the mass percentage of the titanium carbide in the dense composite material is lower than the mass percentage of the titanium silicide and the mass percentage of the titanium silicon carbide in the dense composite material.

4. The cooling plate according to claim 1, wherein the mass percentage of the titanium silicide in the dense composite material is higher than the mass percentage of the titanium silicon carbide.

5. The cooling plate according to claim 1, wherein in the dense composite material, at least one of the titanium silicide, the titanium silicon carbide, and the titanium carbide is disposed between the silicon carbide particles and covers the surface of the silicon carbide particles.

6. The cooling plate according to claim 1, wherein in the dense composite material, the titanium carbide is dispersed in the titanium silicide.

7. The cooling plate according to claim 1, wherein the titanium silicide is $TiSi_2$.

8. The cooling plate according to claim 1, wherein the difference in average linear thermal expansion coefficient between the dense composite material and alumina is 0.5 ppm/K or less at a temperature in the range of 40° C. to 570° C.

9. The cooling plate according to claim 1, wherein the dense composite material has an average linear thermal expansion coefficient in the range of 7.2 to 8.2 ppm/K at a temperature in the range of 40° C. to 570° C.

10. The cooling plate according to claim 1, wherein the dense composite material has a thermal conductivity of 75 W/mK or more.

11. The cooling plate according to claim 1, wherein the dense composite material has a four-point bending strength of 200 MPa or more.

12. The cooling plate according to claim 1, wherein in the dense composite material, the number of silicon carbide particles 10 μm or more in length along the major axis in a SEM image (backscattered electron image) of a region 90 μm in length and 120 μm in width magnified 1000 times is 16 or more.

13. A cooling plate having an internal refrigerant path and used for cooling an alumina ceramic member, including:
    a first substrate formed of a dense composite material, the dense composite material containing silicon carbide particles, titanium silicide, titanium silicon carbide, and titanium carbide, the silicon carbide particle content being in the range of 37 to 60 mass %, each of the amounts of titanium silicide, titanium silicon carbide, and titanium carbide being lower than the mass percentage of the silicon carbide particles, the percentage of open pores of the dense composite material being 1% or less,
    a second substrate formed of the dense composite material and having a groove for the refrigerant path on a surface thereof facing the first substrate, and
    a metal bonding layer between the first substrate and the surface of the second substrate in which the groove is formed, the metal bonding layer being formed by thermal compression bonding of the first substrate and the second substrate with a metal bonding material interposed therebetween.

14. The cooling plate according to claim 13, wherein the metal bonding layer contains as the metal bonding material an aluminum alloy bonding material containing Mg or Si and Mg and is formed by thermal compression bonding at a temperature lower than or equal to the solidus temperature of the bonding material.

15. The cooling plate according to claim 13, wherein the mass percentage of the titanium carbide in the dense composite material is lower than the mass percentage of the titanium silicide and the mass percentage of the titanium silicon carbide in the dense composite material.

16. The cooling plate according to claim 13, wherein the mass percentage of the titanium silicide in the dense composite material is higher than the mass percentage of the titanium silicon carbide.

17. The cooling plate according to claim 13, wherein in the dense composite material, at least one of the titanium silicide, the titanium silicon carbide, and the titanium carbide is disposed between the silicon carbide particles and covers the surface of the silicon carbide particles.

18. The cooling plate according to claim 13, wherein in the dense composite material, the titanium carbide is dispersed in the titanium silicide.

19. The cooling plate according to claim 13, wherein the titanium silicide is $TiSi_2$.

20. The cooling plate according to claim 13, wherein the difference in average linear thermal expansion coefficient between the dense composite material and alumina is 0.5 ppm/K or less at a temperature in the range of 40° C. to 570° C.

21. The cooling plate according to claim 13, wherein the dense composite material has an average linear thermal expansion coefficient in the range of 7.2 to 8.2 ppm/K at a temperature in the range of 40° C. to 570° C.

22. The cooling plate according to claim 13, wherein the dense composite material has a thermal conductivity of 75 W/mK or more.

23. The cooling plate according to claim 13, wherein the dense composite material has a four-point bending strength of 200 MPa or more.

24. The cooling plate according to claim 13, wherein in the dense composite material, the number of silicon carbide particles 10 μm or more in length along the major axis in a SEM image (backscattered electron image) of a region 90 μm in length and 120 μm in width magnified 1000 times is 16 or more.

25. A method for manufacturing a cooling plate having an internal refrigerant path and used for cooling an alumina ceramic member, the method comprising the steps of:
(a) forming first to third substrates using a dense composite material, the dense composite material containing silicon carbide particles, titanium silicide, titanium silicon carbide, and titanium carbide, the silicon carbide particle content being in the range of 37 to 60 mass %, each of the amounts of titanium silicide, titanium silicon carbide, and titanium carbide being lower than the mass percentage of the silicon carbide particles, the percentage of open pores of the dense composite material being 1% or less,
(b) forming a punched portion in the second substrate by punching the second substrate from one surface to the other surface of the second substrate such that the punched portion has the same shape as the refrigerant path, and
(c) performing thermal compression bonding of the first to third substrates with a metal bonding material interposed between the first substrate and one surface of the second substrate and between the third substrate and the other surface of the second substrate.

26. The method for manufacturing the cooling plate according to claim 25, wherein in the step (c), the metal bonding material is an aluminum alloy bonding material containing Mg or Si and Mg, and thermal compression bonding is performed at a temperature lower than or equal to the solidus temperature of the bonding material.

27. A method for manufacturing a cooling plate having an internal refrigerant path and used for cooling an alumina ceramic member, the method comprising the steps of:
(a) forming a first substrate and a second substrate using a dense composite material, the dense composite material containing silicon carbide particles, titanium silicide, titanium silicon carbide, and titanium carbide, the silicon carbide particle content being in the range of 37 to 60 mass %, each of the amounts of titanium silicide, titanium silicon carbide, and titanium carbide being lower than the mass percentage of the silicon carbide particles, the percentage of open pores of the dense composite material being 1% or less,
(b) forming a groove for the refrigerant path in one surface of the second substrate, and
(c) performing thermal compression bonding of the first substrate and the second substrate with a metal bonding material interposed between the first substrate and the surface of the second substrate in which the groove is formed.

28. The method for manufacturing the cooling plate according to claim 27, wherein in the step (c), the metal bonding material is an aluminum alloy bonding material containing Mg or Si and Mg, and thermal compression bonding is performed at a temperature lower than or equal to the solidus temperature of the bonding material.

29. A member for a semiconductor manufacturing apparatus comprising:
an alumina electrostatic chuck including an electrostatic electrode and a heater electrode,
a cooling plate according to claim 1, and
a cooling plate-chuck bonding layer formed by thermal compression bonding of the first substrate of the cooling plate and the electrostatic chuck with a metal bonding material interposed between a surface of the first substrate of the cooling plate and the electrostatic chuck.

30. The member for a semiconductor manufacturing apparatus according to claim 17, wherein the cooling plate-chuck bonding layer contains as the metal bonding material an aluminum alloy bonding material containing Mg or Si and Mg and is formed by thermal compression bonding at a temperature lower than or equal to the solidus temperature of the bonding material.

31. A member for a semiconductor manufacturing apparatus comprising:
an alumina electrostatic chuck including an electrostatic electrode and a heater electrode,
a cooling plate according to claim 13, and
a cooling plate-chuck bonding layer formed by thermal compression bonding of the first substrate of the cooling plate and the electrostatic chuck with a metal bonding material interposed between a surface of the first substrate of the cooling plate and the electrostatic chuck.

32. The member for a semiconductor manufacturing apparatus according to claim 31, wherein the cooling plate-chuck bonding layer contains as the metal bonding material an aluminum alloy bonding material containing Mg or Si and Mg and is formed by thermal compression bonding at a temperature lower than or equal to the solidus temperature of the bonding material.

\* \* \* \* \*